(12) United States Patent
Nakamura et al.

(10) Patent No.: US 6,757,865 B1
(45) Date of Patent: Jun. 29, 2004

(54) TURBO-CODE ERROR CORRECTING DECODER, TURBO-CODE ERROR CORRECTION DECODING METHOD, TURBO-CODE DECODING APPARATUS, AND TURBO-CODE DECODING SYSTEM

(75) Inventors: Takahiko Nakamura, Tokyo (JP); Hachiro Fujita, Tokyo (JP); Hideo Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/568,163

(22) Filed: May 10, 2000

(30) Foreign Application Priority Data

Jul. 21, 1999 (JP) .......................................... 11-205789

(51) Int. Cl.[7] .............................................. H03M 13/03
(52) U.S. Cl. ...................................................... 714/796
(58) Field of Search ................................ 714/786, 791, 714/792, 794, 795, 796; 375/262, 265, 341

(56) References Cited

U.S. PATENT DOCUMENTS

| 5,594,742 A | * | 1/1997 | Hemmati ..................... 714/792 |
| 5,933,462 A | * | 8/1999 | Viterbi et al. ................ 375/341 |
| 6,343,368 B1 | * | 1/2002 | Lerzer ......................... 714/796 |
| 6,510,536 B1 | * | 1/2003 | Crozier et al. .............. 714/755 |

FOREIGN PATENT DOCUMENTS

| EP | 0963048 | 12/1999 |
| EP | 0963048 A2 | 12/1999 |
| EP | 1030457 | 8/2000 |
| GB | 2345830 | 7/2000 |
| WO | WO9740582 | 10/1997 |
| WO | WO0057560 | 9/2000 |
| WO | WO0059118 | 10/2000 |

OTHER PUBLICATIONS

"A Maximum Likelihood Decoding Algorithm For Turbo Codes", John S. Sadowsky, Department of Electrical Engineering, Arizona State University, 1997 IEEE, pp. 929–933.
S. Benedetto et al, TDA Progress Report, vol. 42, No. 124, pp. 63–87 ( 1996 ), "Soft–Output Decoding Algorthms in Iterative Decoding of Turbo Codes".

* cited by examiner

*Primary Examiner*—Christine T. Tu
(74) *Attorney, Agent, or Firm*—Birch, Stewart, Kolasch & Birch, LLP

(57) ABSTRACT

In a conventional turbo-code decoding apparatus, there is a need for calculating a state transition probability for MAP decoding of convolutional codes composing turbo codes in an error correcting decoder and a channel state needs to be measured based on soft decision information to calculate the probability, by which an arithmetic operation amount is enormously increased.

Turbo-code error correction decoding is performed by executing operations in a branch metric based forward path metric calculation step of calculating a forward path metric based on a branch metric with calculating the branch metric for a transition to an adjacent time point and a soft decision information calculation step of calculating N bits of soft decision information based on the branch metric, the forward path metric, and a backward path metric with calculating the backward path metric based on the branch metric.

16 Claims, 26 Drawing Sheets

FIG.4A  FORWARD PATH METRIC
FIG.4B  BACKWARD PATH METRIC
FIG.4C  SOFT DECISION INFORMATION

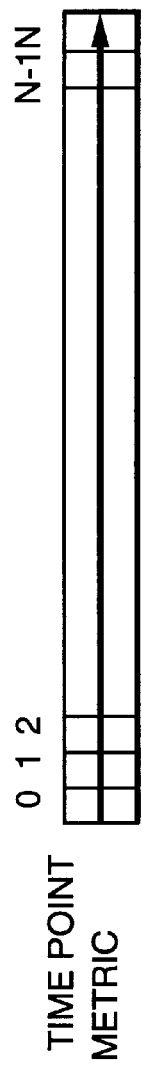
FIG.7A FORWARD PATH METRIC
FIG.7B BACKWARD PATH METRIC
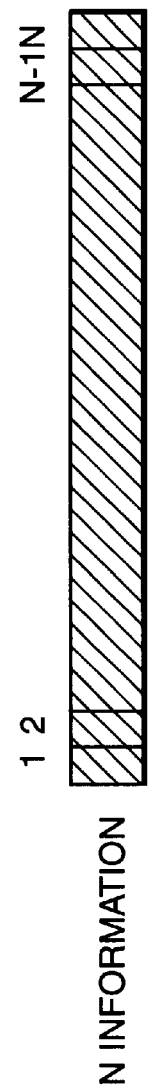
FIG.7C SOFT DECISION INFORMATION

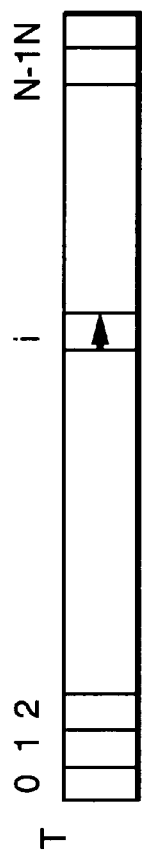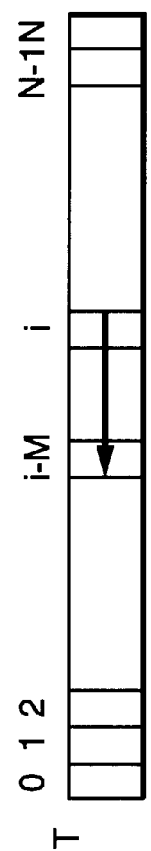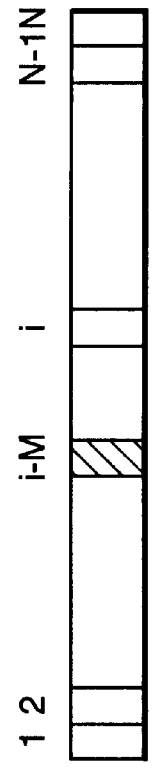
FIG.11A FORWARD PATH METRIC
FIG.11B BACKWARD PATH METRIC
FIG.11C SOFT DECISION INFORMATION

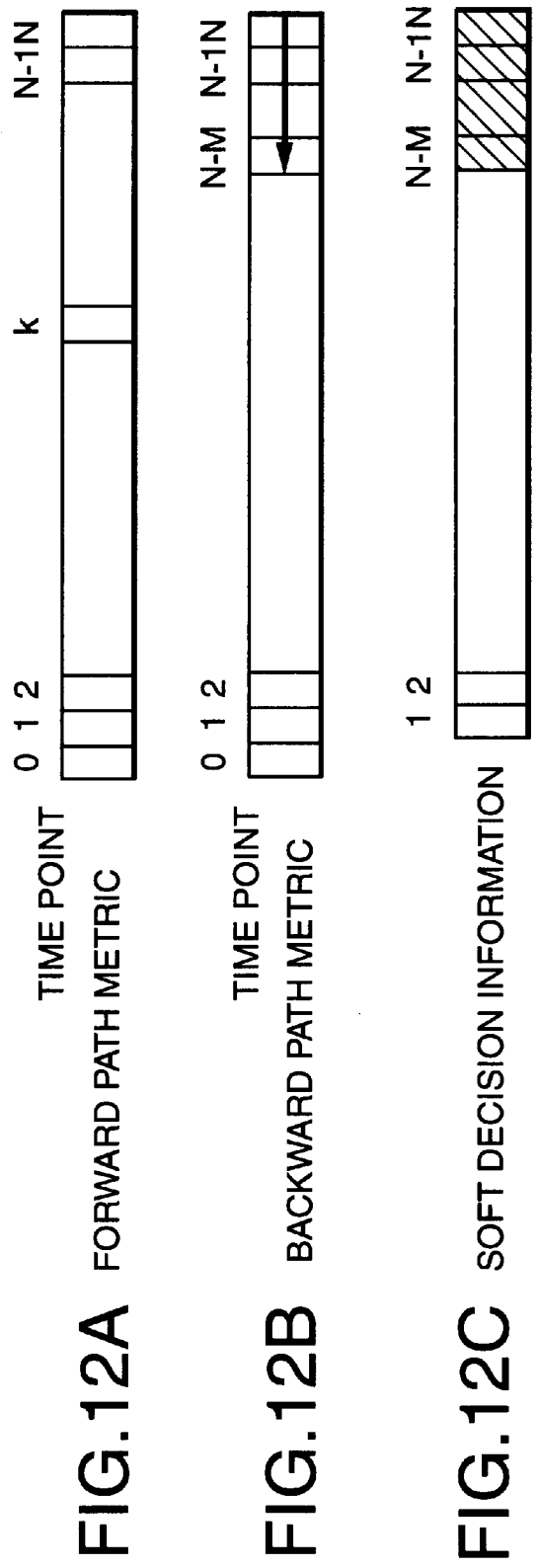

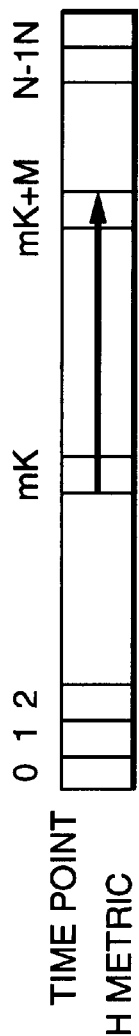
FIG.16A FORWARD PATH METRIC
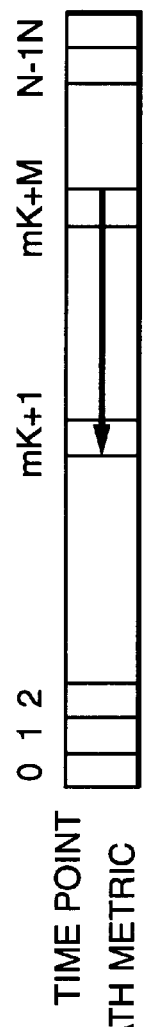
FIG.16B BACKWARD PATH METRIC
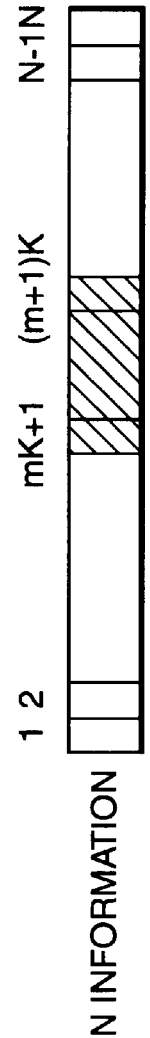
FIG.16C SOFT DECISION INFORMATION

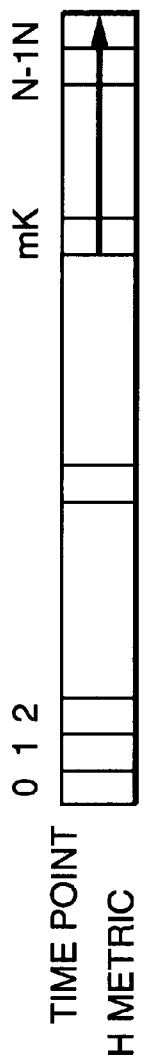
FIG.17A  FORWARD PATH METRIC
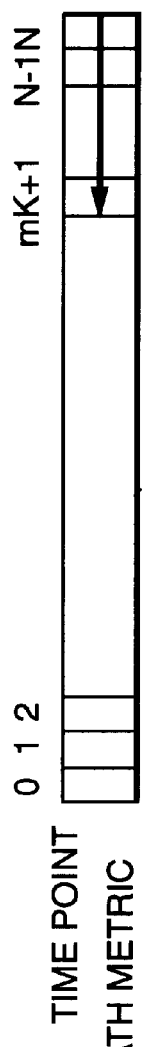
FIG.17B  BACKWARD PATH METRIC
FIG.17C  SOFT DECISION INFORMATION ered sequence directly. In# TURBO-CODE ERROR CORRECTING DECODER, TURBO-CODE ERROR CORRECTION DECODING METHOD, TURBO-CODE DECODING APPARATUS, AND TURBO-CODE DECODING SYSTEM

BACKGROUND OF THE INVENTION

1. Field of the Invention

This invention relates to a turbo-code error correcting decoder, a turbo-code error correction decoding method, a turbo-code decoding apparatus, and a turbo-code decoding system for decoding a coded sequence which has been submitted to turbo-coding in a wireless communication device or other communication fields.

2. Description of the Related Art

Referring to FIG. 26, there is shown a block diagram of a constitution of a general turbo encoding apparatus.

In FIG. 26, reference numerals 301, 302, 303, 304, 305, 306, and 307 designate a first systematic convolutional encoder, a second systematic convolutional encoder, an interleaver, an input point, a first sequence output point, a second sequence output point, and a third sequence output point, respectively.

Referring to FIG. 27, there is shown a block diagram of a constitution of a conventional turbo-code decoding apparatus described in "Turbo Code for Deep-Space Communications" (P. 29 to P. 39, D. Divsalar and F. Pollara, Feb. 15 in 1995) in the TDA Progress Report.

In FIG. 27, reference numerals 401, 402, 403, 404, 405, 406, 407, 408, 409, 410, and 411 designate a first MAP decoder for an error correction decoding called an MAP decoding on a first sequence and a second sequence encoded by the first systematic convolutional encoder 301 in FIG. 26, a second MAP decoder for an error correction decoding called an MAP. decoding on a first sequence and a third sequence encoded by the second systematic convolutional encoder 302, a first interleaver, a second interleaver, a first deinterleaver, a second deinterleaver, a hard decision circuit for generating hard decision information from soft decision information, a first sequence input point, a second sequence input point, a third sequence input point, and an output point.

Operations of the first interleaver 403 and the second interleaver 404 are the same as for those of the interleaver 303 of the turbo encoding apparatus in FIG. 26. In addition, the first deinterleaver 405 and the second deinterleaver 406 change an order of data in a procedure reverse to that of the interleaver 303.

Referring to FIG. 28, there is shown a flowchart of an operation for error correction decoding with the first MAP decoder. The second MAP decoder performs the same operation.

In FIG. 28, there are shown a step S201 of setting an initial value, a step S202 of calculating a state transition probability, a step S203 of calculating a probability of a transition to each state at tracing a path in a forward direction, a step S204 of calculating a probability of a transition to each state at tracing a path in a backward direction, and a step S205 of calculating soft decision information after decoding on the basis of values calculated in Steps S202, S203, and S204, respectively.

Next, an operation of the turbo encoding apparatus is described below with reference to FIG. 26.

In the turbo encoding apparatus, N bits of an information sequence is input from the input point 304 and output from the first output point 305 as the first sequence directly. In addition, N bits of the input information sequence is also entered into the first systematic convolutional encoder 301 in the same order and N bits of the sequence is output from the second output point 306 as the second sequence. Furthermore, N bits of the input information sequence is converted to one having a different order in the interleaver 303 and then entered into the second systematic convolutional encoder 302 to output N bits of the sequence as the third sequence from the third output point 307.

The first, second, and third sequences each having N bits and generated in this manner are combined so as to be a coded sequence and then transmitted through a communication line or transmitted as a radiowave.

Next, an operation of a turbo-code decoding apparatus on a reception side is described below with reference to FIG. 27.

The transmitted coded sequence is received with errors appended. The received sequence is separated to the first, the second, and the third sequences, which are input from the first input point 408, the second input point 409, and the third input point 410 to the turbo-code decoding apparatus, respectively.

The first MAP decoder 401 generates soft decision information L1 after decoding from the first sequence, the second sequence, and value L1* generated on the basis of the soft decision information generated in the second MAP decoder 402 in the previous stage. At the first decoding, however, an L1* value entered in the first MAP decoder 401 is set to zero (0) as the lowest reliability for all the bits. Next, it generates L1−L1* and enters it to the first interleaver 403 and its order is changed so as to be L2*.

Next, the second MAP decoder 402 generates soft decision information L2 after decoding from the first sequence interleaved by the second interleaver 404, the third sequence, and L2* generated by the first interleaver 403. L2−L2* is calculated for the generated L2 and its order is changed so as to be L1* in the first deinterleaver 405. L1* is used in the first MAP decoder 401 when L1* is repeatedly decoded.

This operation is repeated by the predetermined number of times. When the decoding operation is terminated, the second deinterleaver 406 changes an order of the soft decision information L2 generated by the second MAP decoder 402 and the hard decision circuit 407 judges whether it is 0 or 1 and outputs the result from the output point 411. Subsequently, an operation of the first MAP decoder 401 is described below with reference to a flowchart in FIG. 28. The second MAP decoder 402 performs the same operation.

In Step S201, an initial value is set for a transition probability in the state in the forward direction and in the state in the backward direction. Next in Step S202, a channel state is measured based on the received soft decision information and a state transition probability is calculated in accordance with a state of the channel. Then, in Step S203 calculation is made for a probability of a transition to each state when a path is traced in the forward direction from the state transition probability calculated in Step S202, and in Step S204 calculation is made for a probability of a transition to each state when a path is traced in the backward direction from the state transition probability calculated in Step S202. Finally in Step S205, soft decision information after decoding is calculated on the basis of the values calculated in Steps S202, S203, and S204.

In a conventional turbo-code decoding apparatus, however, it is necessary to calculate a state transition probability in an execution of MAP decoding for convolutional codes composing turbo-codes in an error correcting decoder and the calculation of the probability requires a measurement of a state of a channel on the basis of soft decision information, by which an arithmetic operation amount is enormously increased disadvantageously.

Furthermore, in order to increase a precision of decoding, error correction decoding processing needs to be performed by a regular number of times with the first MAP decoder and the second MAP decoder until hard decision information is obtained. This number of times, however, is a fixed value and therefore processing is performed even if almost no error occurs, by which the processing is disadvantageously delayed by an intrinsically unnecessary time period.

In addition, only a single coded sequence can be input to a turbo-code decoder, and therefore the second MAP decoder is put in an idle state for a time period during which processing is performed by the first MAP decoder, thereby disadvantageously lowering a processing efficiency.

SUMMARY OF THE INVENTION

The present invention is provided to solve the above problems. It is a first object of the present invention to reduce a calculation amount by a constitution of an error correction part similar to that for decoding of a normal convolutional decoder so as to simplify an arithmetic operation required for decoding.

It is a second object of the present invention to achieve flexible processing by changing the number of times for correction encoding flexibly in accordance with error conditions.

It is a third object of the present invention to perform processing more efficiently by permitting a parallel use of two error correcting decoders in a turbo-code decoding apparatus.

In accordance with an aspect of the present invention, there is provided a turbo-code error correcting decoder comprising branch metric calculating means for calculating a branch metric for a transition from time point t−1 (t=1, 2, - - - , N) to time point t, branch metric storing means for storing the branch metric, forward path metric calculating means for calculating a forward path metric at the time point t−1 after reading out the branch metric from the branch metric storing means, forward path metric storing means for storing the forward path metric, backward path metric calculating means for calculating a backward path metric at the time point t after reading out the branch metric from the branch metric storing means, backward path metric storing means for storing the backward path metric, and soft decision information calculating means for calculating soft decision information after reading out the branch metric from the branch metric storing means, reading out the forward path metric from the forward path metric storing means, and reading out the backward path metric from the backward path metric storing means.

In accordance with another aspect of the present invention, there is prbvided a turbo-code error correcting decoder comprising branch metric calculating means for calculating a branch metric for a transition from time point t−1 (t=1, 2, - - - , N) to time point t, branch metric storing means for storing the branch metric, forward path metric calculating means for calculating a forward path metric at the time point t−1 after reading out the branch metric from the branch metric storing means, forward path metric storing means for storing the forward path metric, backward path metric calculating means for calculating a backward path metric at time point t after reading out the branch metric from the branch metric storing means, and soft decision information calculating means for calculating soft decision information after receiving the backward path metric from the backward path metric calculating means, reading out the branch metric from the branch metric storing means, and reading out the forward path metric from the forward path metric storing means.

In accordance with another aspect of the present invention, there is provided a turbo-code error correction decoding method comprising a step(a) of calculating a forward path metric based on a branch metric after calculating the branch metric for a transition to an adjacent time point and a step(b) of calculating N bits of soft decision information based on the branch metric, the forward path metric, and a backward path metric after calculating the backward path metric based on the branch metric.

In accordance with another aspect of the present invention, there is provided a turbo-code error correction decoding method comprising a step(a) of calculating soft decision information from time point 1 to time point N−M (N>M) and a step(b) of calculating soft decision information from time point N−M+1 to time point N, wherein step(a) includes an execution during a transition of t from 1 to N of a step of executing calculation of a branch metric for a transition from time point t−1 to time point t and calculation of a forward path metric at the time point t based on the branch metric while incrementing t until t exceeds M (N>M), a step of setting an initial value of a backward path metric, a step of calculating a backward path metric at time point t−M based on the branch metric, and a step of calculating soft decision information at the time point t−M based on the branch metric, the forward path metric, and the backward path metric.

In accordance with another aspect of the present invention, there is provided a turbo-code error correction decoding method comprising a step(a) of initializing variable m, a step(b) of calculating soft decision information from time point 1 to time point mK while incrementing the variable m, and a step(b) of calculating soft decision information from time point mK+1 to time point N, wherein the step(b) includes a repetition of a step of executing calculation of a branch metric for a transition from the time point t−1 to the time point t and calculation of a forward path metric at the time point t based on the branch metric during a transition of t to mK+M (K<M<N) or to N, a step of setting an initial value of the backward path metric, a step of calculating a backward path metric at the time point t based on the branch metric during a transition of t from mK+K−1 to mK+1, and a step of calculating soft decision information at the time point t based on the branch metric, the forward path metric, and the backward path metric during a transition of t from mK+1 to mK+K, while incrementing m during a transition of t up to N.

In accordance with another aspect of the present invention, there is provided a turbo-code error correcting decoder, with the number of information bits submitted to turbo-code decoding set to N, comprising branch metric calculating means for calculating a branch metric for a transition from time point t−1 (t=1, 2, - - - , N) to time point t, forward path metric calculating means for calculating a forward path metric at the time point t−1, a size comparison result of two forward path metrics converging to respective states, and a differential value between them, comparison result storing means for storing the comparison result, differential value storing means for storing the differential value, and soft decision information calculating means for calculating soft decision information based on the comparison result read from the comparison result storing means and the differential value read from the differential value storing means by using a SOVA algorithm.

In accordance with another aspect of the present invention, there is provided a turbo-code decoding apparatus including CRC error decision means for deciding a CRC error based on a decoded CRC code and controlling a repetition of decoding processing of turbo-codes on the basis of the result achieved by the CRC error decision means.

In accordance with another aspect of the present invention, there is provided a turbo-code decoding system comprising a turbo-code decoding apparatus having a first turbo-code error correcting decoder and a second turbo-code error correcting decoder, first coded sequence storing means for storing a first coded sequence, second coded sequence storing means for storing a second coded sequence, and a switching means for switching a connection between the first turbo-code error correcting decoder and the second turbo-code error correcting decoder and the first coded sequence storing means and the second coded sequence storing means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a diagram showing a procedure for a turbo-code error correction decoding method according to the first embodiment of the present invention.

FIG. 7 is a diagram showing a procedure for the turbo-code error correction decoding method according to the second embodiment of the present invention.

FIG. 11 is a diagram showing a procedure for the turbo-code error correction decoding method according to the fourth embodiment of the present invention.

FIG. 12 is a diagram showing a procedure for the turbo-code error correction decoding method according to the fourth embodiment of the present invention.

FIG. 16 is a diagram showing a procedure for the turbo-code error correction decoding method according to the seventh embodiment of the present invention.

FIG. 17 is a diagram showing a procedure for the turbo-code error correction decoding method according to the seventh embodiment of the present invention.

DESCRIPTION OF THE PREFERRED EMBODIMENTS

First Embodiment

Figure 1:
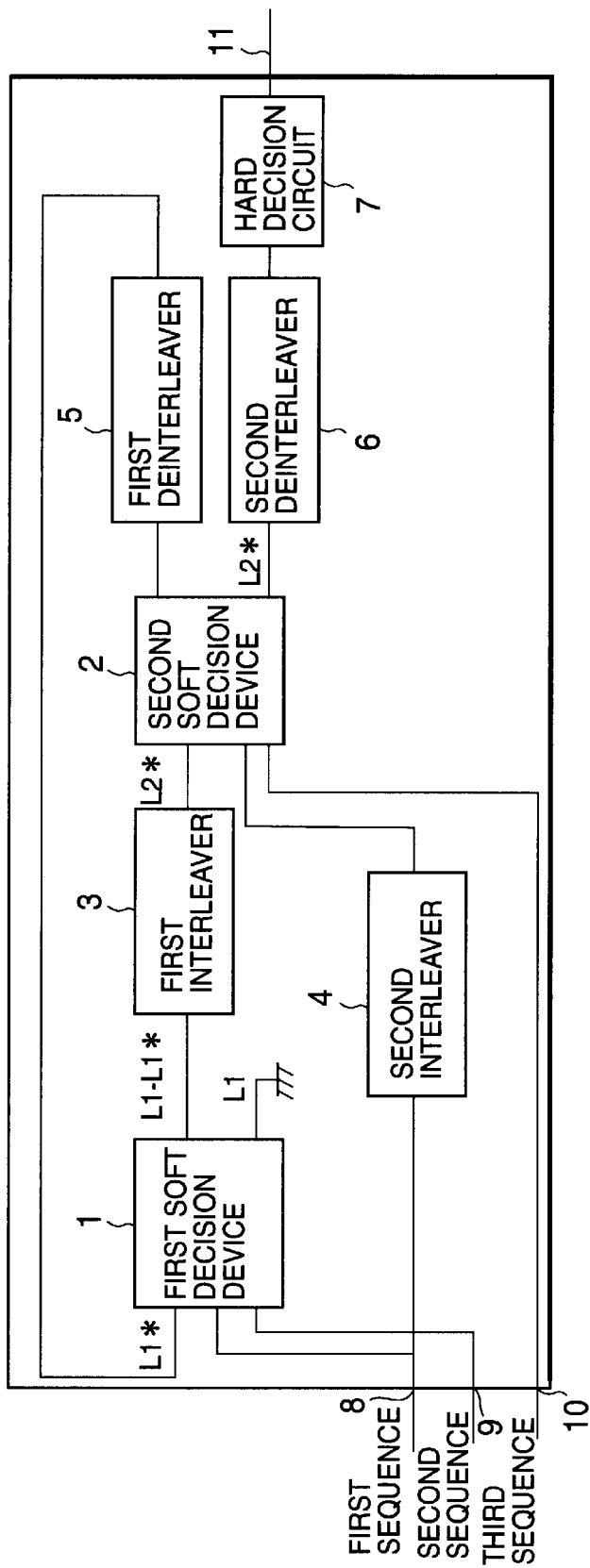
FIG. 1 is a configuration diagram of a turbo-code decoding apparatus according to a first embodiment of the present invention.

Referring to FIG. 1, there is shown a block diagram of a turbo-code decoding apparatus according to a first embodiment of the present invention.

In FIG. 1, there are shown a first soft decision device 1 for error correction decoding in which soft decision data is extracted from coded first and second sequences, a second soft decision device 2 for an error correction decoding in which soft decision data is extracted from first and third sequences, a first interleaver 3, a second interleaver 4, a first deinterleaver 5, a second deinterleaver 6, a hard decision circuit 7 for generating hard decision information based on soft decision information, an input point 8 for the first sequence, an input point 9 of the second sequence, an input point 10 of the third sequence, and an output point 11, respectively.

Figure 2:
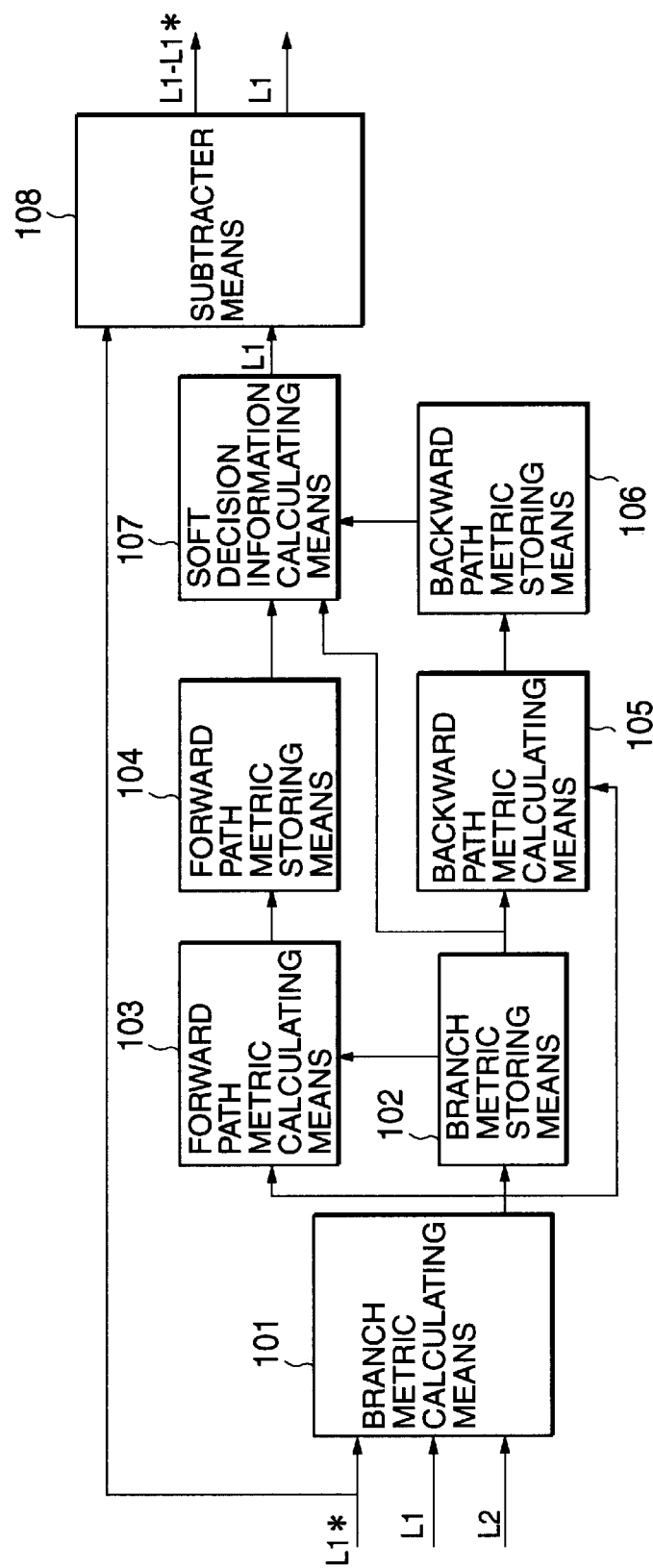
FIG. 2 is a configuration diagram of a soft decision device according to the first embodiment of the present invention.

Referring to FIG. 2, there is shown a block diagram of a constitution of the first soft decision device 1. The first soft decision device 1 and the second soft decision device 2 have the same constitution.

In FIG. 2, there are shown branch metric calculating means 101, branch metric storing means 102, forward path metric calculating means 103, forward path metric storing means 104, backward path metric calculating means 105, backward path metric storing means 106, soft decision information calculating means 107, and subtracter means 108.

Figure 3:
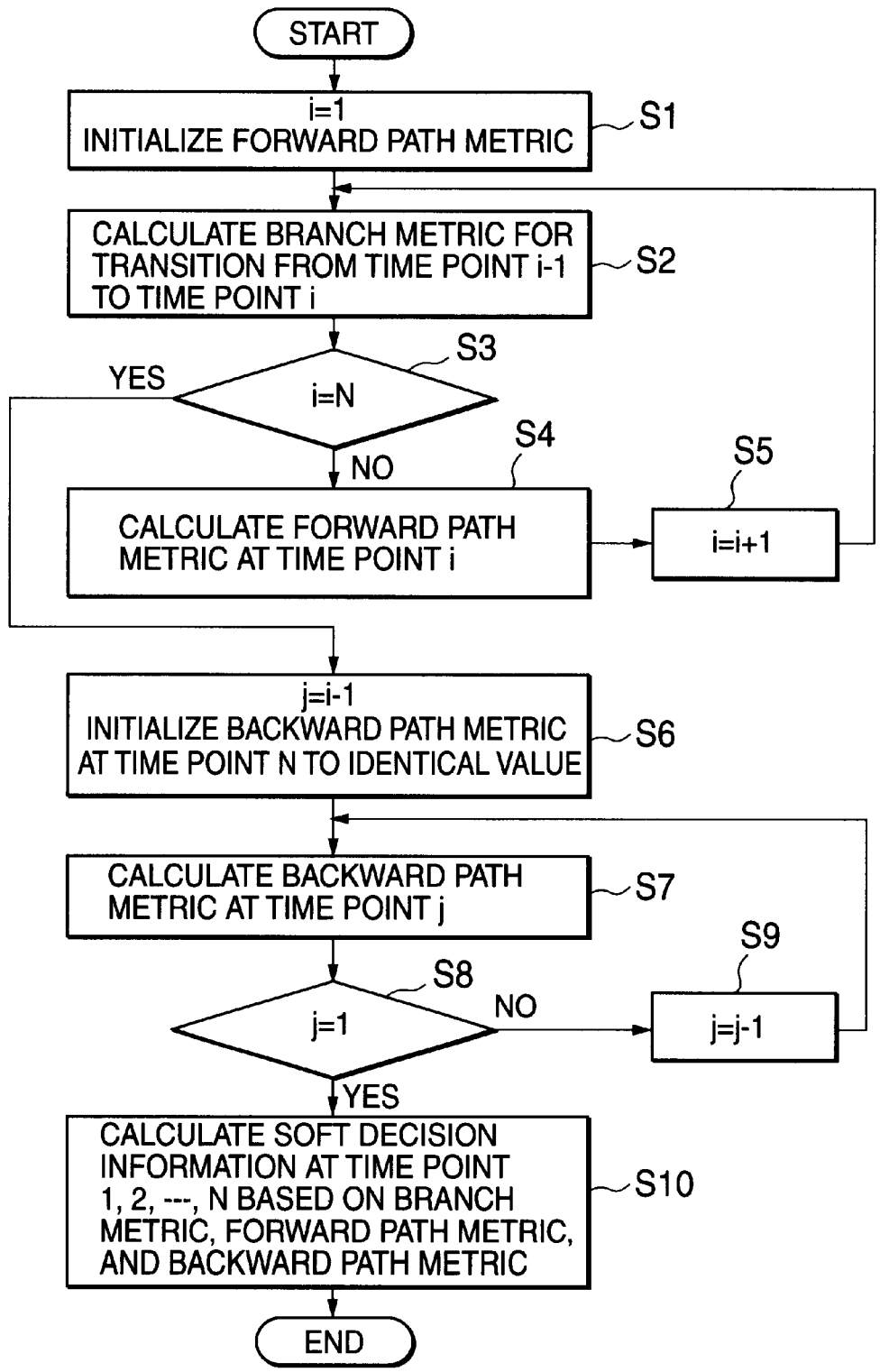
FIG. 3 is a flowchart of a turbo-code error correction decoding method according to the first embodiment of the present invention.

Referring to FIG. 3, there is shown a flowchart of an operation of error correction decoding by means of the first soft decision device 1.

In FIG. 3, there are shown Step S1 of setting an initial value for calculating a forward path metric, Step S2 of calculating a branch metric at each time point, Step S3 of determining an end of forward path metric and branch metric calculations, Step S4 of calculating a forward path metric, Step S5 of incrementing a time point by one, Step S6 of setting an initial value for calculating a backward path metric, Step S7 of calculating a backward path metric, Step S8 of determining an end of a backward path metric calculation, Step S9 of decrementing a time point by one, and Step S10 of calculating soft decision information after decoding.

Next, an operation of the turbo-code decoding apparatus is described below with reference to FIG. 1.

A transmitted coded sequence is received with an error which has mainly occurred on a line and accumulated in a storage device (not shown) such as a buffer. These received sequences are separated into a first sequence, a second sequence, and a third sequence, which are sequentially input from a first input point 8, a second input point 9, and a third input point 10 to a turbo-code decoding apparatus.

The first soft decision device 1 generates soft decision information L1 after decoding based on the first sequence, the second sequence, and value L1* generated based on soft decision information generated by the second soft decision device 2 in the previous stage. The value L1* entered in the first soft decision device 1 is set to 0 as the lowest reliability to all bits at the first decoding. Next, L1–L1* is generated and input to the first interleaver 3 and the first interleaver 3 changes its order so as to obtain L2*.

Next, the second soft decision device 2 generates soft decision information L2 after decoding based on the first sequence interleaved by the second interleaver 4, the third sequence, and L2* generated by the first interleaver 3 and calculates L2–L2* for the generated L2. The order of L2–L2* is changed by the first deinterleaver 5 so as to obtain L1*. L1* is used by the first soft decision device 1 when iterative decoding is performed.

This operation is repeated by a predetermined number of times. If the decoding operation is terminated, an order of the soft decision information L2 generated by the second soft decision device 2 is changed by the second deinterleaver 6, the hard decision circuit 10 judges whether it is 0 or 1 and the result is output from the output point 11.

Next, the operation of the first soft decision device 1 will be described in details below with reference to FIGS. 2 and 3.

First, the first sequence, the second sequence, and L1* are transmitted to the branch metric calculating means 101. The branch metric calculating means 101 sets a value of pointer i indicating the first time point to 1 in Step S1 and sets a forward path metric value in each state at time point 0. At this time, the path metric value in an initial state in an encoding apparatus is set to a value-great enough in comparison with other states.

Next, in Step S2, a branch metric for a transition from time point i−1 to time point i is calculated for each branch based on the soft decision information of each received bit by comparing a received bit expected value with an actual received bit. The calculated branch metric is stored in the branch metric storing means 102.

Subsequently in Step S3, it is judged whether or not all data is completed to be processed, in other words, whether or not the pointer value i at the first time point is N. If i is set to N, the calculation of the branch metric and the forward path metric is terminated, and therefore the control progresses to Step S6; otherwise, the control progresses to Step S4.

In Step S4, the forward path metric calculating means 103 calculates a forward path metric at the time point i by adding a value of the branch metric stored in the branch metric storing means 102 to the forward path metric value at the time point i−1 and selecting a greater value out of two path metrics converging to each state and the value is stored into the forward path metric storing means 104.

Next, in Step S5 the pointer value i at the first time point is incremented and then the control returns to Step S2 to repeat the above operation. Now, in the above operation, as shown in FIG. 4(a), forward path metrics from time point i (=0) to time point N−1 have been calculated. Subsequently in Step S6, the backward path metric calculating means 105 sets pointer value j indicating the second time point to N−1 and sets the backward path metric value at the time point N to the same value for each state unless terminating processing is performed in the encoding operation, for example. If the terminating processing is performed, a path metric value in a terminated state is set to a value great enough in comparison with other states.

Next in Step S7, a backward path metric at the time point j is calculated by adding a branch metric value stored in the branch metric storing means 102 to a backward path metric value at time point j+1 and selecting a greater value out of two path metrics converging to each state and the value is then stored in the backward path metric storing means 106.

Next in Step S8, it is judged whether or not all the calculation is completed, in other words, whether or not the pointer value j at the second time point is 1. If j=1, the calculation of the backward path metric is assumed to be terminated and the control progresses to Step S10. Otherwise, the pointer value j at the second time point is decremented in Step S9 and the control returns to Step S7 to repeat the above operation. In the above operation, as shown in FIG. 4(b), backward path metrics from the time point N to the time point 1 have been calculated. Finally, in Step S10, the soft decision information calculating means 107 reads the forward path metric at the time point i−1 from the forward path metric storing means 104, the branch metric for the transition from the time point. i−1 to the time point i from the branch metric storing means 102, and the backward path metric at the time point i from the backward path metric storing means 106, calculates the soft decision information L1 after decoding of the information bit corresponding to the time point i, and then calculates L1–L1* with the subtracter means 108, so that the L1 and L1–L1* are treated as outputs from the first soft decision device.

The calculation in the soft decision output means 107 is performed specifically in a method as described below.

First, regarding soft decision information P, the hard decision information is set to 1 if a sign of P is positive or set to 0 if the sign is negative, and their reliability information is assumed to be an absolute value of P.

Figure 5:
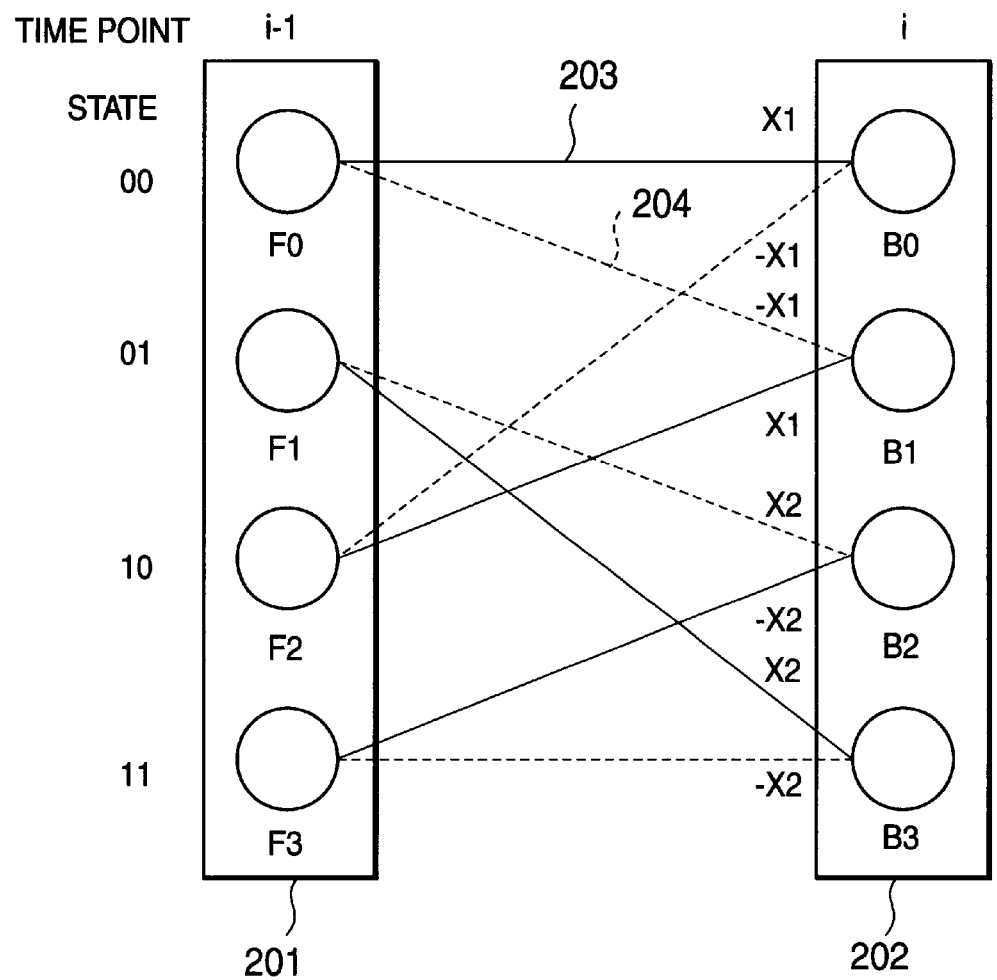
FIG. 5 is a diagram showing a relationship between a forward path metric, a backward path metric, and a branch metric.

Referring to FIG. 5, there is shown a relationship between the forward path metric at the time point i−1 and the backward path metric at the time point i; reference numeral 201 designates forward path metric values F0, F1, F2, and F3 of states 00, 01, 10, and 11, respectively. Reference numeral 202 designates backward path metric values B0, B1, B2, and B3 of states 00, 01, 10, and 11, respectively.

In this diagram, solid lines between respective forward path metrics at the time point i−1 and respective backward path metrics at the time point i indicate branches to be decoded to 0 and dashed lines therebetween indicate branches to be decoded to 1. At this point, if values X1, X2, −X1, and −X2 described for respective branches are assumed to be branch metrics for a transition from the time point i−1 to the time point i, the soft decision information L1 at the time point i is calculated as follows:

$$L1=MAX(F0+(-X1)+B1,\ F1+(X2)+B2,\ F2+(-X1)+B0,\ F3+(X2)+B3)-MAX(F0+(X1)+B0,\ F1+(-X2)+B3,\ F2+(X1)+B1,\ F3+(-X2)+B2) \quad \text{Eq.(1)}$$

The soft decision output operation is completed by repeating the operation of Step S10 at the time point i from 1 to N.

In the above operation, the soft decision information of the shaded portion in FIG. 4(c) has been calculated.

For a turbo-code decoding apparatus having an error correcting decoder for turbo decoding like this soft decision device, a transition probability to each state in the MAP decoding operation needs not be calculated from a channel state based on the soft decision information of received bits, and the soft decision information after decoding can be obtained with the same repetitive arithmetic operation as the normal Viterbi decoding operation, by which an arithmetic operation amount can be reduced so as to achieve high-speed error decoding processing.

Second Embodiment

Figure 6:
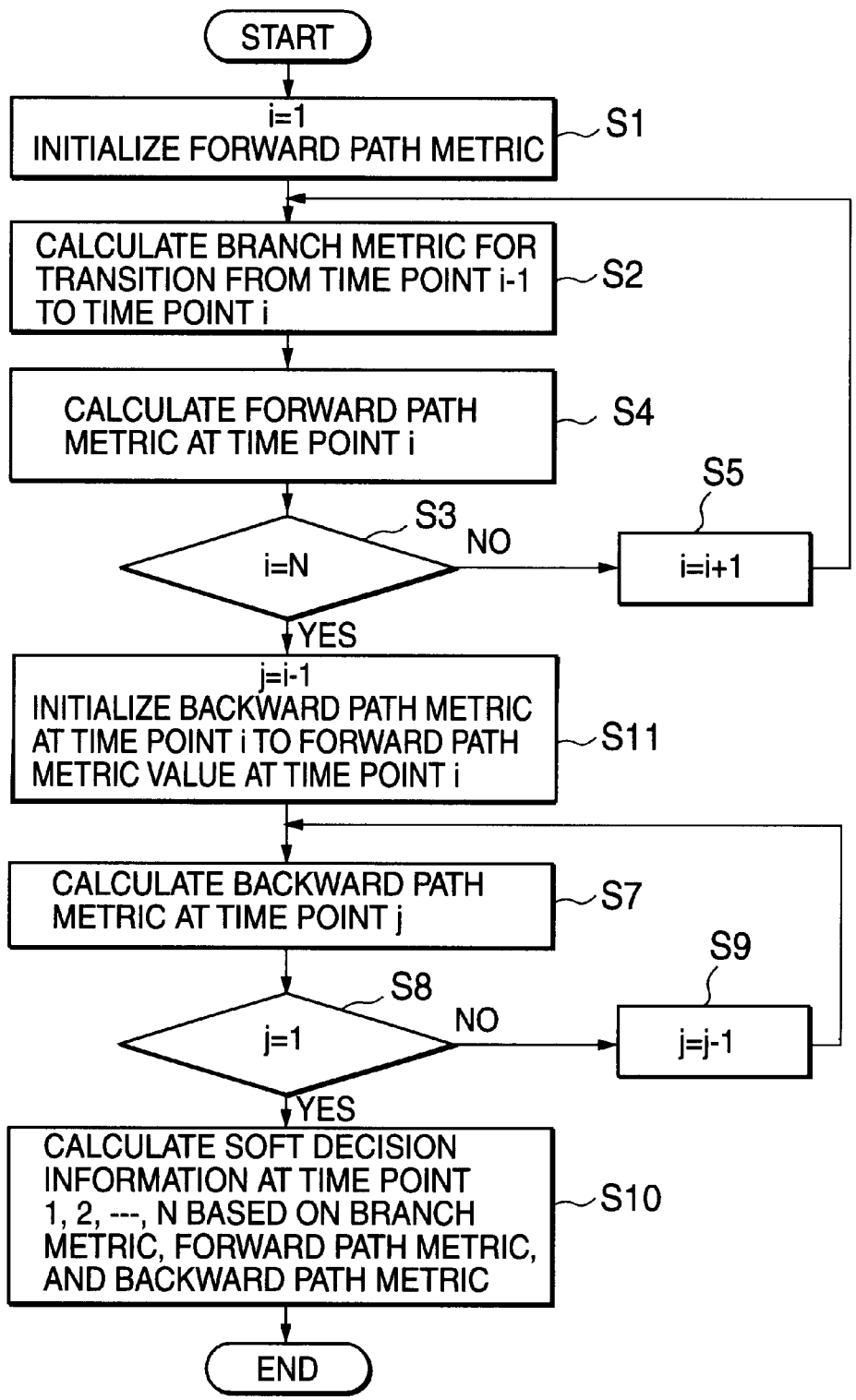
FIG. 6 is a flowchart of a turbo-code error correction decoding method according to a second embodiment of the present invention.

Referring to FIG. 6, there is shown a flowchart of an operation for error correction decoding with a soft decision device according to the second embodiment of the present invention, in which a path metric value at the time point N finally calculated for the forward path metric is used as an initial value of the backward path metric in FIG. 3.

In FIG. 6, S11 indicates a step of setting a forward path metric value at the time point N as an initial value of a backward path metric.

Furthermore in FIG. 6, by necessity of calculating the backward path metric at the time point N, processing in Step S4 is performed before Step S3 for a termination decision in comparison with the flowchart in FIG. 1 and a forward path metric from time point 1 to time point N is calculated in Step S4.

Next, the operation is described below with reference to FIG. 6.

First, the branch metric and the forward path metric are calculated by repeating the operations in Step S1 to Step S5 up to the time point N. Thereby, the forward path metric is calculated within a range shown in FIG. 7(a).

Next, in Step S11, a forward path metric value at the time point N is set to an initial value of the backward path metric.

Subsequently, the operations from Step S7 to Step S9 are repeated to calculate the backward path metric up to the time point 1. By this operation, the backward path metric has been calculated within a range shown in FIG. 7(b).

Then, in Step S10, the operation of calculating soft decision information corresponding to the information bit at the time point i is repeated from the time point 1 to the time point N. By this operation, the soft decision information has been obtained within a range of the shaded portion in FIG. 7(c).

In this manner, the calculation result based on the forward path metric is treated as an initial value of the backward path metric, by which the forward path metric calculation result is reflected on calculating the backward path metric and therefore it becomes possible to generate extremely reliable reliability information after decoding and to improve a performance.

Third Embodiment

Figure 8:
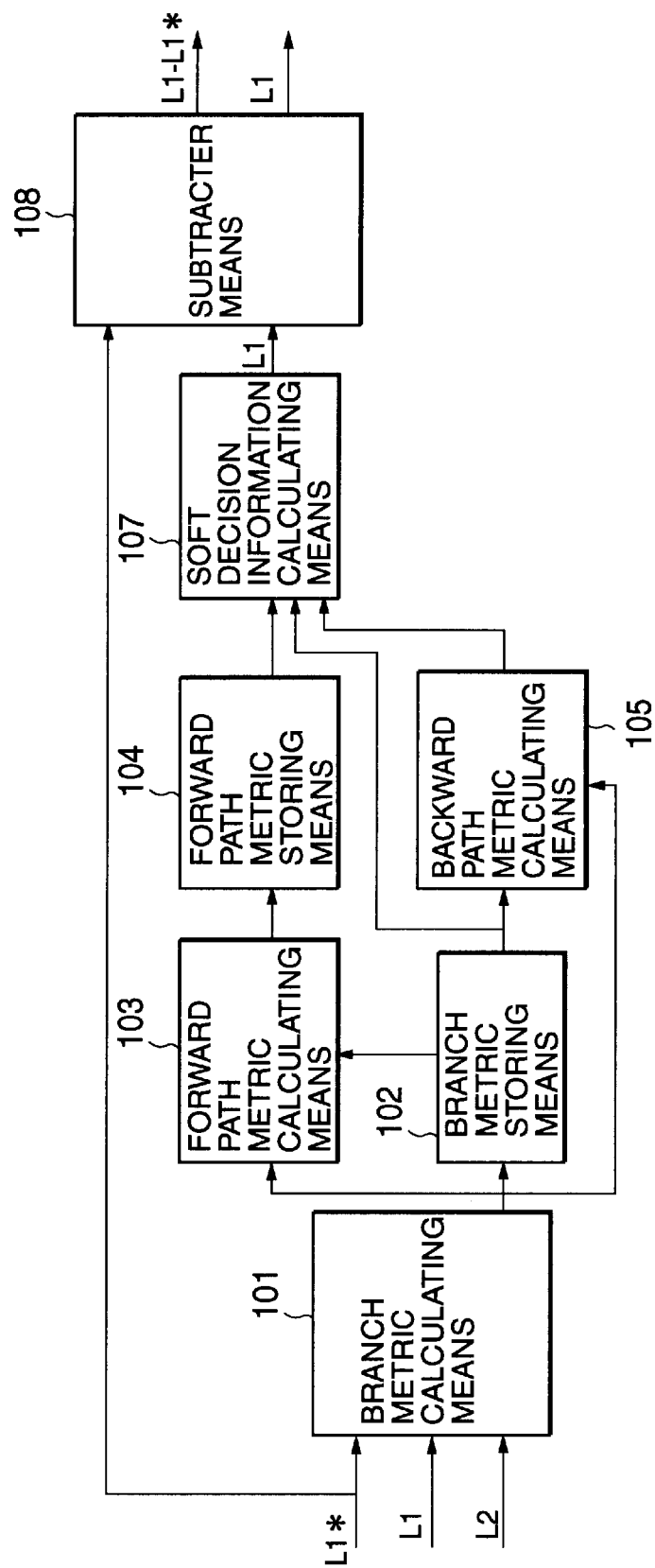
FIG. 8 is a configuration diagram of a soft decision device according to a third embodiment of the present invention.

Referring to FIG. 8, there is shown a soft decision device which is a turbo-code error correcting decoder according to a third embodiment of the present invention, in which soft decision information is calculated whenever the backward path metric is calculated by the backward path metric calculating means 105 in the soft decision device in FIG. 2.

Figure 9:
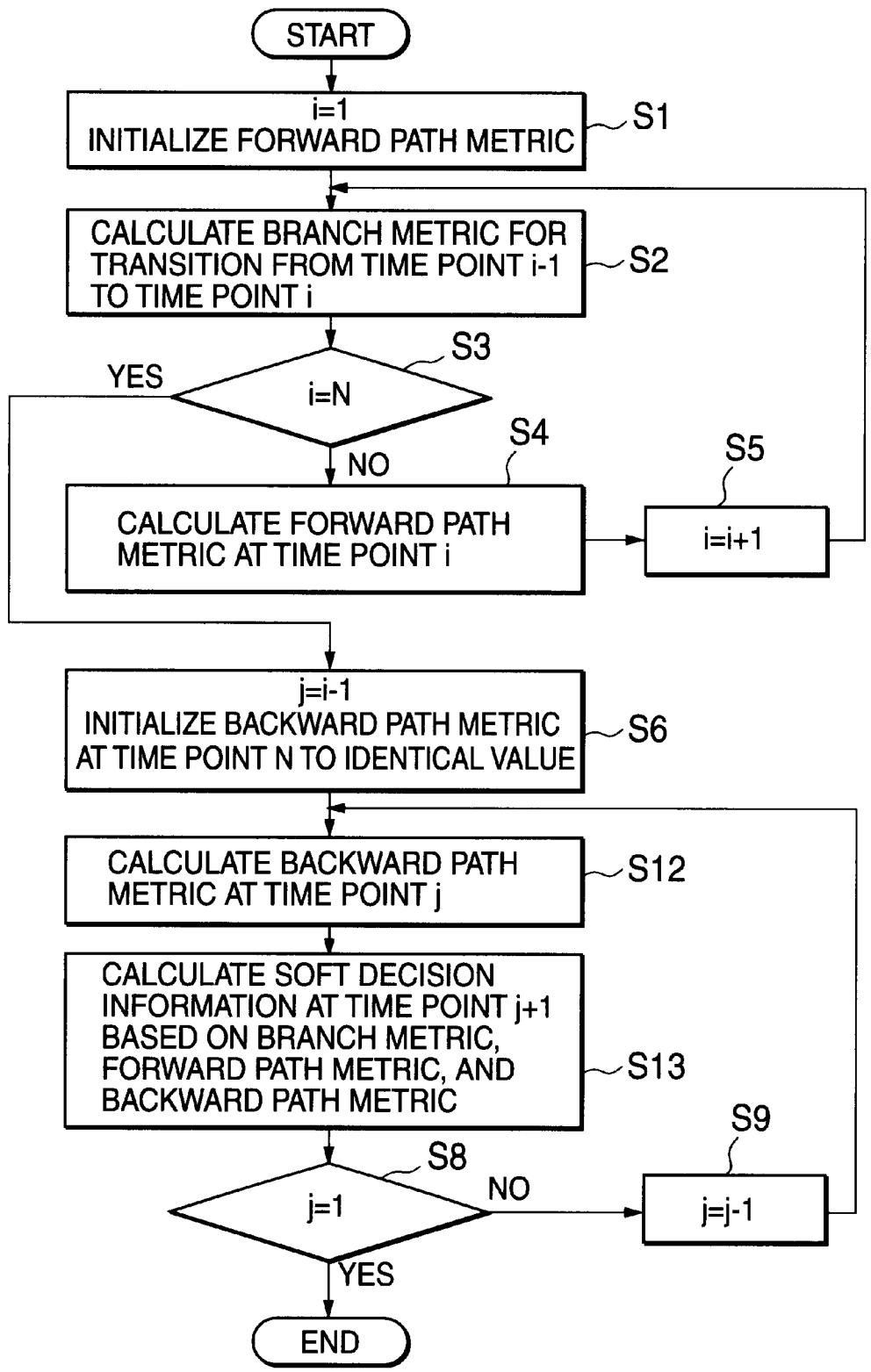
FIG. 9 is a flowchart of a turbo-code error correction decoding method according to the third embodiment of the present invention.

Referring to FIG. 9, there is shown a flowchart of operations for error correction decoding with the soft decision device shown in FIG. 8.

In this flowchart, there are shown Step S12 of calculating a backward path metric at time point j and Step S13 of calculating soft decision information at time point j+1 based on a branch metric, a forward path metric, and a backward path metric.

Next, an operation of this soft decision device is described below with reference to FIGS. 8 and 9.

First, operations of Steps S1 to S5 are repeated at time point i from 1 to N, a branch metric of a transition at each point from the time point 1 to the time point N is calculated and stored in the branch metric storing means 102, and then a forward path metric at each points of the time point 1 to N−1 is calculated and stored in the forward path metric storing means 104.

Next, in Step S6, the backward path metric calculating means 105 sets a value of pointer Vindicating a second time point to N−1 and sets a value of the backward path metric at the time point N.

Next, in Step S12, a backward path metric at time point j is calculated by adding a branch metric value stored in the branch metric storing means 102 to a backward path metric value at the time point j+1 and selecting a greater value out of two path metrics converging to each state and then it is transmitted to the soft decision information calculating means 107.

Then in Step S13, the soft decision information calculating means 107 which has received the backward path metric at the time point j reads the forward path metric at the time point j−1 from the forward path metric storing means 104 and the branch metric of a transition at the time point j−1 to the time point j from the branch metric storing means 102, calculates the soft decision information L1 after decoding of the information bit corresponding to the time point j−1, and then calculates L1−L1* with the subtracter means 108 and considers L1 and L1−L1* as outputs from the first soft decision device.

Next, in Step S8, it is judged whether or not all the calculations are completed, in other words, whether or not the pointer value j at the second time point is 1. If j is 1, processing is terminated with a determination that the calculation of the backward path metric is completed.

Otherwise, the pointer value j at the second time point is decremented in Step S9 and the control returns to Step S12 to repeat the above operations.

In this manner, the soft decision information is calculated whenever a backward path metric at each time point is calculated and the soft decision information of all the information bits is generated, by which there is no need for storing means for storing backward path metrics and therefore a scale of a circuit can be reduced.

Fourth Embodiment

Figure 10:
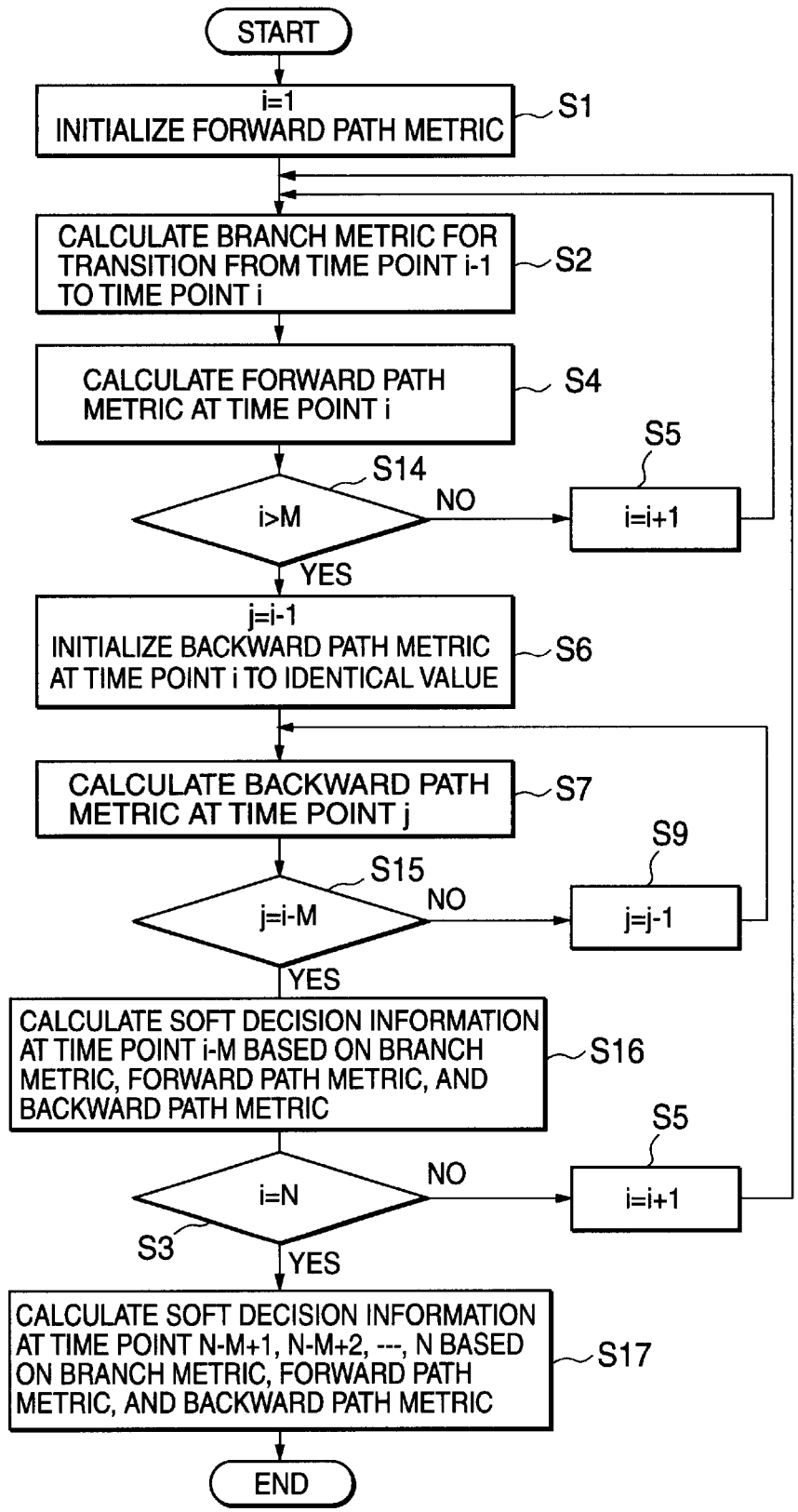
FIG. 10 is a flowchart of a turbo-code error correction decoding method according to a fourth embodiment of the present invention.

Referring to FIG. 10, there is shown a flowchart of an operation for error correction decoding with a soft decision device according to a fourth embodiment of the present invention, in which soft decision information at all time points is not calculated at a time, but the soft decision information is calculated with a division at point M in FIG. 3.

A block configuration of the soft decision device according to the fourth embodiment is the same as one in FIG. 2.

In FIG. 10, there are shown Step S14 of judging whether or not an arithmetic operation of a forward path metric is continued, Step S15 of judging whether or not a backward path metric is continued, Step S16 of calculating soft decision information at time point i–M, and Step S17 of calculating soft decision information at time point N–M+1 or after bits.

Referring to FIGS. 11 and 12, there are shown procedures of path metric arithmetic operations according to this embodiment.

Next, the operation is described below with reference to FIGS. 2 and 10.

First, in Step S1, the branch metric calculating means 101 sets a forward path metric value in each state at time point 0 with a value of a pointer i indicating a first time point set to 1.

Subsequently, in Step S2, a branch metric is calculated for a transition from time point i–1 to the time point i, and the calculated branch metric is stored in the branch metric storing means 102. Next, in Step S4, the branch metric value calculated in Step S2 is added to a forward path metric value at the time point i–1, a forward path metric at the time point i is calculated, and the calculated forward path metric is stored in the forward path metric storing means 104. Subsequently, in Step S14, it is judged whether or not the pointer value i at the first time point is less than M; if i is less than M, the pointer at the first time point is incremented in Step S5 and then a branch metric and a forward path metric at the next time point are calculated repeatedly. By this operation, the forward path metric at the time point i shown in FIG. 11(a) has been calculated.

If the time pointer i is M in Step S14, backward path metric calculating means 105 sets the second time pointer value j to i–1 and sets the backward path metric value at the time point i to an identical value for each state.

Next, in Step S7, a branch metric value read out from the branch metric storing means 102 is added to the backward path metric value at the time point j+1 to calculate the backward path metric at the time point j. In Step S15, the control progresses to Step S16 if the second time pointer value j is i–M or otherwise it progresses to Step S9.

In Step S9 the second time point j is decremented and then the control returns to Step S7 to repeat the above operations.

By this operation, the backward path metric from the time point i to the time point i–M shown in FIG. 11(b) has been calculated.

Next, in Step S16, the soft decision information calculating means 107 reads the forward path metric at the time point i–M–1 from the forward path metric storing means 103, a branch metric for a transition from the time point i–M–1 to the time point i–M from the branch metric storing means 102, and the backward path metric at the time point i–M from the backward path metric storing means 104, calculates the soft decision information at the time point i–M, and then performs subtracting processing with the subtracter means 108 to output the result.

By this operation, the soft decision information of the shaded portion in FIG. 11(c) has been calculated.

Unless the first time pointer i is N in Step S3, the first time pointer is incremented in Step S5 and the control returns to Step S2 to calculate a branch metric and a forward path metric. At this point, in Steps S2 and S3, new values are overwritten on metric values at the oldest time point among the stored values in the branch metric storing means 102 and the forward path metric storing means 103.

Afterward, the same operations are repeated and the soft decision information at the time point N–M is calculated. Then, i is equal to N in Step S3 and therefore the control progresses to Step S17 to calculate the soft decision information from the time point N–M+1 to the time point N. In Step S17, the soft decision information of the shaded portion in FIG. 12(c).

If N is set to 30 and M is set to 10 specifically, the operations below will be performed.

First, by repeating the operations in Steps S1, S2, S14, and S5 until i becomes 11, calculation is made for branch metrics from time point 0 to time point 1, - - - , and from time point 10 to time point 11 and forward path metrics at time point 1 to time point 11 and the values are stored in the branch metric storing means 102 and the forward path metric storing means 103.

Next, by repeating the operations in Steps S6, S7, S15, and S9 during a transition of j from 10 to 1, backward path metrics from time point 10 to time point 1 are calculated and the values are stored in the backward path metric storing means 106.

Next, in Step S16, the soft decision information at time point (11–10=) 1 is calculated and output.

Then, i is incremented in Step S5, and when i becomes 12 calculation is made for a branch metric from time point 11 to time point 12 and a forward path metric at time point 12 in Steps S2 and S4, and in Step S14 the control shifts to Step S6 since i=12>10.

Next, the operations in Steps S6, S7, S13, and S9 are repeated from 11 to 2 as the time point j and backward path metrics from time point 11 to time point 2 are obtained.

Subsequently, soft decision information at time point (*12–10=*) 2 is calculated in Step S16.

By this operation repeated until i becomes 30, soft decision information from time point 1 to time point 20 is calculated.

At this point, branch metrics from time point 20 to time point 21, - - - , and from time point 29 to time point 30 are stored in the branch metric storing means 102, forward path metrics from time point 21 to time point 30 are stored in the forward path metric storing means 103, and backward path metrics from time point 21 to time point 30 are stored in the backward path metric storing means 106, and therefore soft decision information from time point 21 to time point 30 is calculated and output in Step S17.

By this operation, a storage capacity can be reduced since only the storage capacity for M (<N) points is required to store the forward path metrics, backward path metrics, and branch metrics.

Furthermore, processing can be performed independently of a transmitted data amount, for example, even if data having a large amount of time points is transmitted.

Fifth Embodiment

Figure 13:
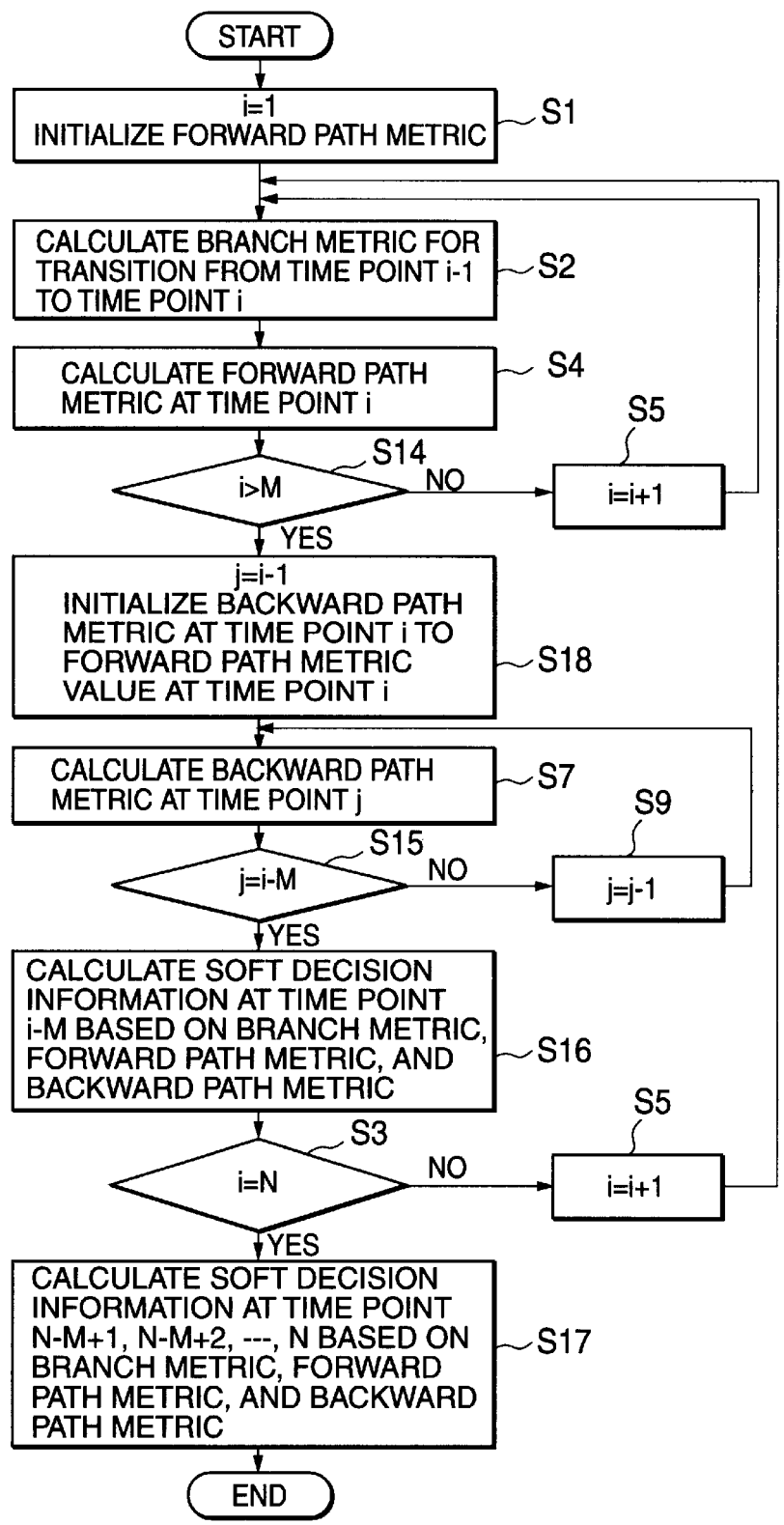
FIG. 13 is a flowchart of a turbo-code error correction decoding method according to a fifth embodiment of the present invention.

Referring to FIG. 13, there is shown a flowchart of an operation for error correction decoding with a soft decision device according to a fifth embodiment of the present invention, in which an initial value of the backward path metric is set to a forward path metric value at the time point i (i>M) in FIG. 10.

A block configuration of a soft decision device according to the fifth embodiment is the same as one in FIG. 2.

In FIG. 13, there is shown Step S18 of setting an initial value of a backward path metric at the time point i to a forward path metric value at the time point i, which is placed instead of Step S7 in FIG. 10.

Next, the operation will be described below with reference to FIGS. 2 and 13.

First, an initial value of a forward path metric is set in Step S1, and then processing from Step S2 to Step S5 is repeated until i becomes greater than M to calculate branch metrics and forward path metrics and the calculated branch metrics and the calculated forward pathmetrics are stored in a branch metric storing means 102 and a path metric storing means 103.

Next in Step S18, a forward path metric value at the time point i (i>M) is set to a backward path metric value.

Subsequently, processing in Steps S7, S8, and S9 is repeated until time point j becomes i−M and then soft decision information at the time point i−M is calculated and output in Step S16.

Then, it is judged whether or not i is N in Step S3; unless it is N, i is incremented in Step S5 and processing after Step S2 is reexecuted.

If i is determined to be N in Step S3, soft decision information from time point N−M+1 to time point N is calculated in Step S17 and it is then output.

In this manner, by using a forward path metric calculation result as an initial value of a backward path metric, the forward path metric calculation result is reflected on a calculation of the backward path metric, by which it becomes possible to generate more reliable reliability information after decoding so as to improve a performance.

Sixth Embodiment

Figure 14:
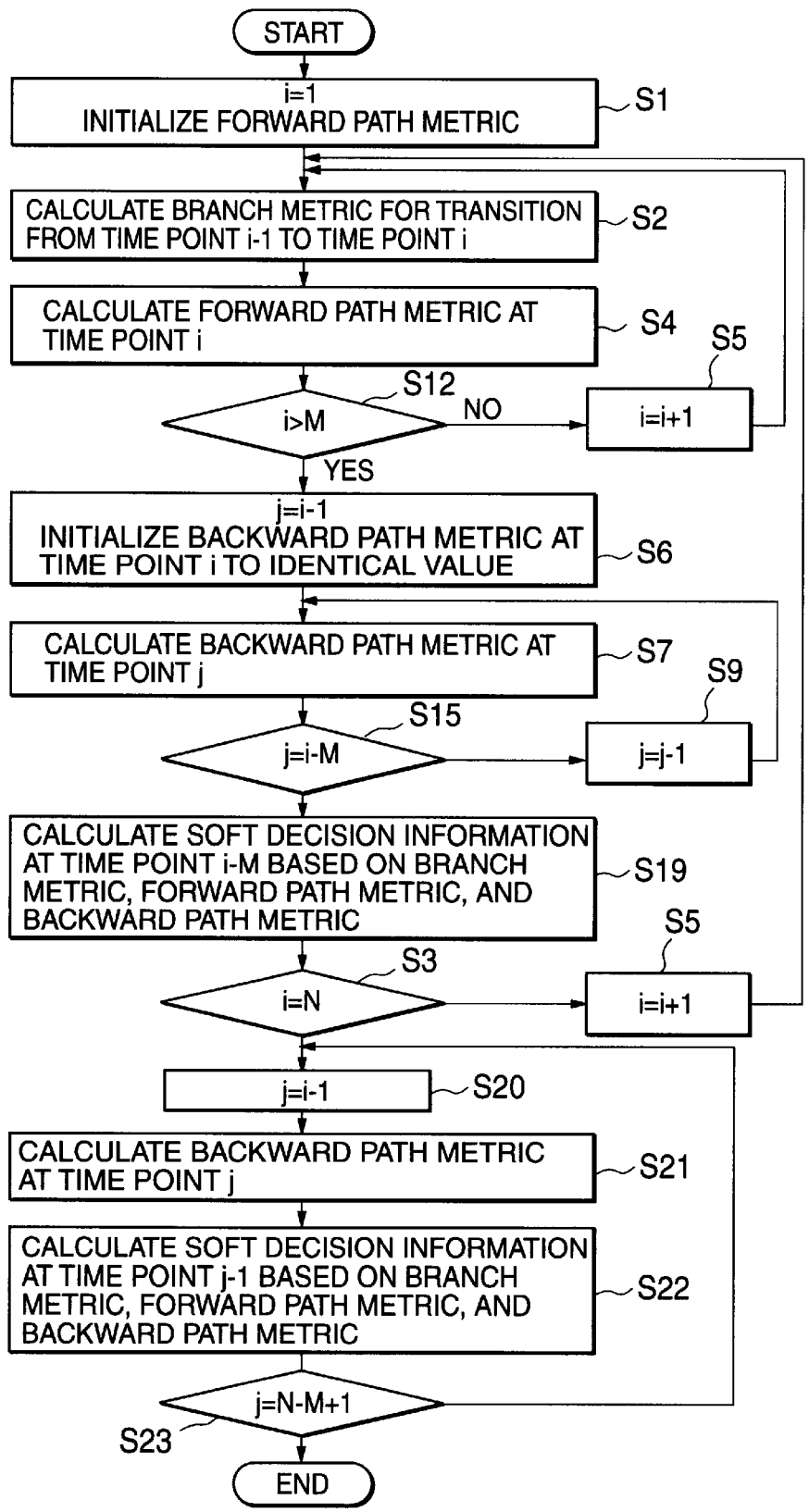
FIG. 14 is a flowchart of a turbo-code error correction decoding method according to a sixth embodiment of the present invention.

Referring to FIG. 14, there is shown a flowchart of an operation for error correction decoding with a soft decision device according to a sixth embodiment of the present invention, in which soft decision information is calculated after a calculation of backward path metrics at respective time points in FIG. 10.

A block configuration of the soft decision device according to the sixth embodiment is the same as one in FIG. 8.

In FIG. 14, there are shown Step S19 of calculating and outputting soft decision information at time point i−M based on a branch metric, a forward path metric, and a backward path metric, Step S20 of setting j to i−1, Step S21 of calculating a backward path metric at time point j, Step S22 of calculating and outputting soft decision information at time point j−1 based on the branch metric, the forward path metric, and the backward path metric, and Step S23 of judging whether or not calculation of the soft decision information at all time points is completed.

Next, the operation will be described below with reference to FIG. 8 and FIG. 14.

First, an initial value of a forward path metric is set in Step S1, processing in Steps S2, S4, S12, and S5 is repeated until i becomes greater than M to calculate branch metrics and forward path metrics, and the values are stored in a branch metric storing means 102 and a path metric storing means 103.

Next, in Step S6, an initial value of a backward path metric is set to the backward path metric value at the time point i by a backward path metric calculating means 105, and then processing in Steps S7, S15, and S9 is repeated to calculate a backward path metric at time point i−M.

Subsequently, in Step S19, soft decision information calculating means 107 calculates soft decision information based on the backward path metric at the time point i−M transmitted from the backward path metric calculating means 105, the forward path metric at the time point i−M−1 read out from the forward path metric storing means 104, and the branch metric from the time point i−M−1 to the time point i−M read out from the branch metric storing means 102 and it is processed for subtraction by a subtracter means 108 before being output.

Next, in Step S3, whether or not i is N is judged; unless i is N, i is incremented in Step S5 and then processing after Step S2 is executed.

If i is N, j is set to i−1 by the backward path metric calculating means 105 in Step S20, the backward path metric is calculated in Step S21, the soft decision information calculating means. 107 calculates soft decision information based on the backward path metric at the time point i−1 transmitted from the backward path metric calculating means 105, the forward path metric at the time point j−2 read out from the forward path metric storing means 104, and the branch metric for a transition from the time point j−2 to the time point j−1 read out from the branch metric storing means 102 in Step S22 and then it is processed for subtraction by the subtracter means 108 before being output.

Next, in Step S23, it is judged whether or not calculation is completed for the soft decision information up to the time point N−M+1; unless it is completed, processing after Step S20 is repeated.

By this operation, there is no need for a storing means for storing backward path metrics and further a scale of a circuit can be reduced.

Seventh Embodiment

Figure 15:
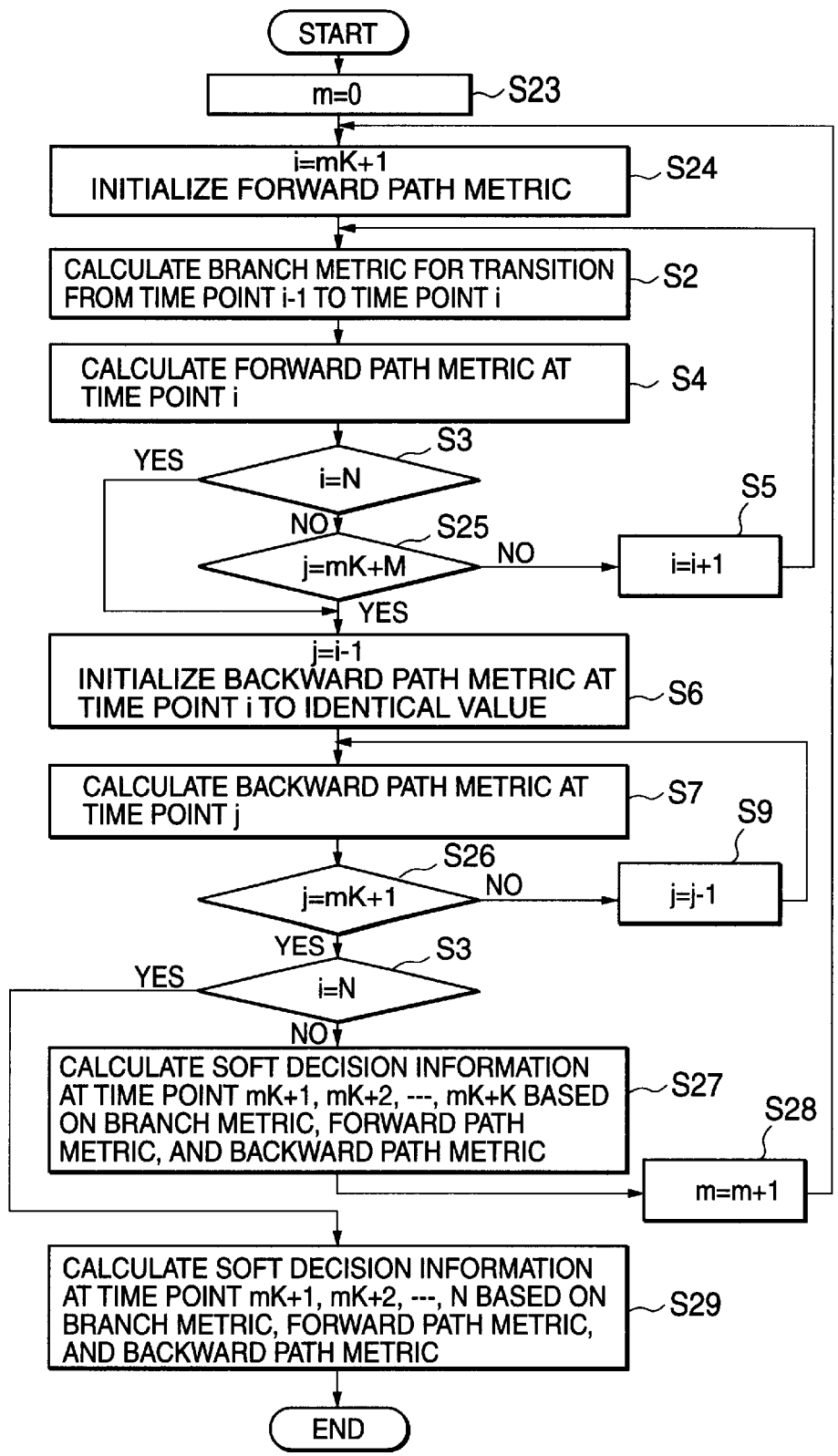
FIG. 15 is a flowchart of a turbo-code error correction decoding method according to a seventh embodiment of the present invention.

Referring to FIG. 15, there is shown a flowchart of an operation for error correction decoding with a soft decision device according to a seventh embodiment of the present invention, in which processing is performed with a division into blocks in units of K bits.

A block configuration in this seventh embodiment is the same as one in FIG. 2.

In FIG. 15, there are shown Step S23 of initializing a block number, Step S24 of setting an initial value of a forward path metric and an initial value of a pointer i indicating a first time point, Step S25 of determining whether or not an arithmetic operation is continued for the forward path metric, Step S26 of determining whether or not an arithmetic operation is continued for a backward path metric, Step S27 of calculating soft decision information of contiguous K bits from time point mK+1, Step S28 of incrementing a block number, and Step S29 of calculating soft decision information at the time point mK+1 bit and after.

Referring to FIGS. 16 and 17, there are shown procedures of path metric arithmetic operations according to this embodiment.

Next, the operation is described below with reference to FIGS. 3 and FIGS. 15.

First, in Step S23, a branch metric calculating means 101 sets m to 0 as an initial value of a block number. Next, in Step S24, an initial value of a pointer i indicating a first time point is set to mK+1 to set forward path metric values in respective states at time point mK.

Subsequently, in Step S2, a branch metric is calculated for a transition from time point i−1 to the time point i, and the calculated branch metric is stored in the branch metric storing means 102.

Next, in Step S4, the branch metric read out from the branch metric storing means 102 is added to the forward path metric value at the time point i−1 by a forward path metric calculating means 103, a forward path metric at the time point i is calculated, and the calculated forward path metric is stored in the forward path metric storing means 104. Subsequently, if the time pointer value is i is less than mK+M in Steps S3 and S25, a pointer of the first time point is incremented in Step S5 and a branch metric and a forward path metric at the next time point are calculated repeatedly.

By this operation, the forward path metrics at the time point mK to the time point mK+M are calculated as shown in FIG. 16(a).

If the time pointer i is above N or mK+M in Steps S3 and S25, backward path metric calculating means 105 sets the backward path metric value at the time point i to an identical value for each state with the pointer value j indicating the second time point set to i−1.

Next, in Step S7, a branch metric value read out from the branch metric storing means 102 is added to the backward path metric value at the time point j+1 to calculate the backward path metric at the time point j and the value is stored in the backward path metric storing means 106. In Step S26, the control progresses to Step S3 if the second time pointer value j is mK+1, or otherwise it progresses to Step S9. Afterward, in Step S9 the second time point j is decremented and then the control returns to Step S7 to execute processing in Step S7 and after.

By this operation, the backward path metric from the time point mK+M to the time point mK+1 is calculated as shown in FIG. 16(b).

Next, unless the first time pointer i is N in Step S3, the soft decision information calculating means 107 reads out the forward path metric at the time point mK to the time point mK+K−1 from the forward path metric storing means 104, a branch metric for a transition from the time point mK to the time point mK+K from the branch metric storing means 102, and the backward path metric at the time point mK+1 to the time point mK+K from the backward path metric storing means 106, calculates the soft decision information at the time point mK+1 to the time point mK+K, and then subtracting processing is performed by the subtracter means 108 to output the result in Step S27. By this operation, the soft decision information of the shaded portion in FIG. 16(c) is calculated. Subsequently in Step S28, a block number is incremented and the same operation is repeated.

If the first time pointer i is N in Step S3, the control progresses to Step S29 to calculate soft decision information at the time point mK+1 to the time point N with the soft decision information calculating means 107, to perform subtracting processing with the subtracter means 108, and to output the result.

By this operation, the soft decision information of the shaded portion in FIG. 17(c) is calculated.

In this operation, it is possible to obtain a soft decision output after decoding by using a repetitive arithmetic operation in the same manner as for a normal Viterbi decoding operation without calculating a transition probability of each state by means of an MAP decoding operation based on a state of channels. In addition, path metrics and branch metrics are stored only for M (<N), and therefore only a small storage capacity is required to obtain soft decision information after decoding.

Eighth Embodiment

Referring to FIG. 8, there is shown a flowchart of an operation for error correction decoding with a soft decision device according to an eighth embodiment of the present invention, in which an initial value of a backward path metric is set to a forward path metric value at time point i (i>M) in FIG. 15.

A block configuration of a soft decision device according to the seventh embodiment is the same as one in FIG. 3.

Figure 18:
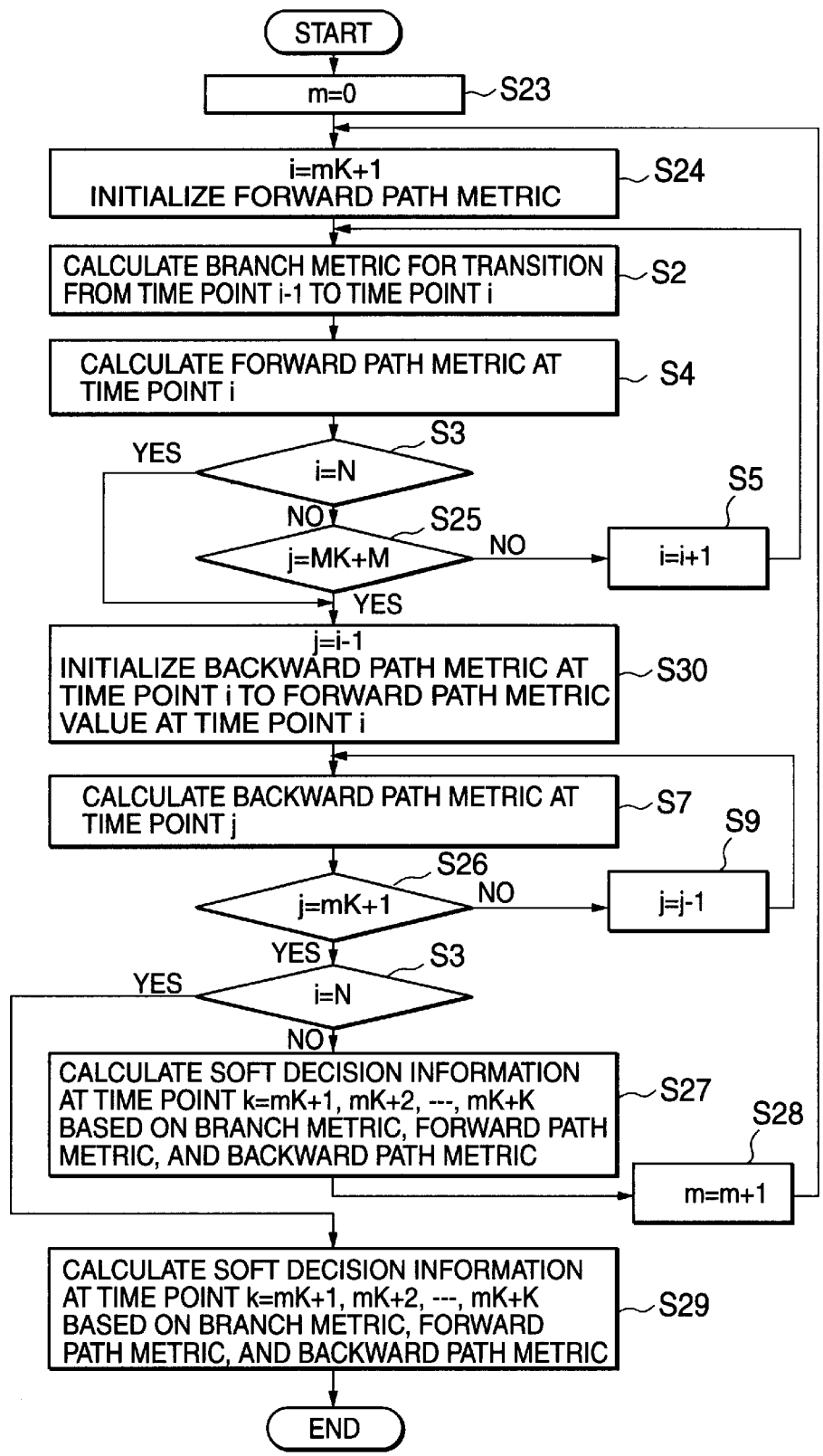
FIG. 18 is a flowchart of a turbo-code error correction decoding method according to an eighth embodiment of the present invention.

In FIG. 18, there is shown Step S30 of initializing a backward path metric at the time point i to a forward path metric value at the time point i.

Next, its operation will be described below with reference to FIGS. 2 and 18.

First, in Step S23, m is set to 0 as an initial value of a block number with a branch metric calculating means 101. Next, processing from Step S24 to Step S5 is repeated and branch metrics and forward path metrics are stored in branch metric storing means 102 and forward path metric storing means 104.

Afterward, processing from Step S7 to S28 is repeated and soft decision information is output. If i is determined to be N in Step S3, soft decision information at time point mK+1 to mK+K is calculated in Step S29 and the result is output.

By this operation, the calculation result of the forward path metrics is more reflected, and therefore more reliable reliability information after convolutional decoding can be generated so as to improve performance.

Ninth Embodiment

Figure 19:
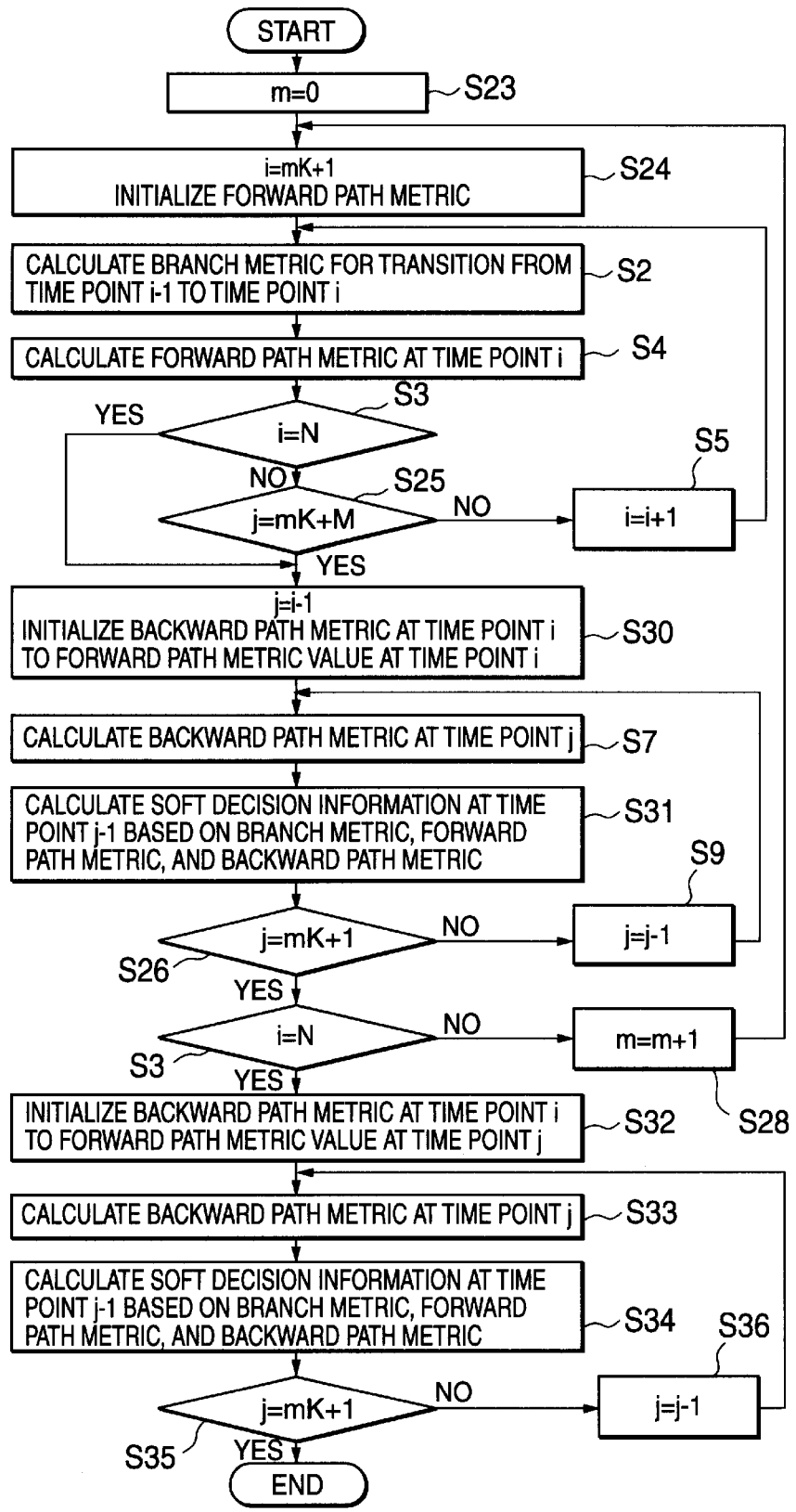
FIG. 19 is a flowchart of a turbo-code error correction decoding method according to a ninth embodiment of the present invention.

Referring to FIG. 19, there is shown a flowchart of an operation for error correction decoding with a soft decision device according to a ninth embodiment of the present invention, in which soft decision information can be calculated without storing a backward path metric in backward path metric storing means in FIG. 18.

A block configuration of the soft decision device according to the ninth embodiment is the same as one in FIG. 9.

In FIG. 19, there are shown Steps S31 of calculating soft decision information at time point j−1 based on a branch metric, a forward path metric, and a backward path metric, Step S32 of setting j to i−1, Step S33 of calculating a backward path metric at time point j, Step S34 of calculating soft decision information at time point j−1 based on the branch metric, the forward path metric, and the backward path metric, Step S35 of judging whether or not processing is completed to the end, in other words, whether or not j is set to mK+1, and Step S36 of decrementing j.

Next, its operation will be described below with reference to FIGS. 8 and 19.

First, in Steps S23, S24, S2, S4, S3, S25, and S5, forward path metrics and branch metrics at the time point mK+1 to mK+M are calculated and then stored in forward path metric storing means 104 and branch metric storing means 102.

Next, in Step S30, a backward path metric at the time point i is initialized to a forward path metric value at the time point j, and in Step S7 a backward path metric at the time point j is calculated with backward path metric calculating means 105.

Subsequently, in Step S31, soft decision information calculating means 107 reads the backward path metric at the time point j from the backward path metric calculating means 105 and the forward path metric at the time point j−1 and the branch metrics at the time point j−1 to time point j from the forward path metric storing means 104 and the branch metric storing means 102 and calculates soft decision information at the time point j−1 and it is output after an arithmetic operation with subtracter means 108.

Next, it is judged whether or not j is set to mk+1 in Step S26; unless it is mk+1, j is decremented in Step S9 and then processing in Step S7 and after is reexecuted.

If j is determined to be mK+1 in Step S26, it is judged whether or not i is N in Step S3; unless it is N, m is incremented in Step S28 and then processing in Step S24 and after is reexecuted.

If i is N in Step S3, the backward path metric at the time point i is initialized to the forward path metric value at the time point j in Step S32 and then soft decision information is calculated to be output in Steps S33 and S34 in the same manner as for Steps S7 and S31.

Next, in Step S35, it is judged whether or not j is mK+1; unless j is mK+1, 1 is subtracted from j and then processing in Step S33 and after is reexecuted.

If j is set to mK+1 in Step S35, processing is terminated.

By this operation, it does not need to use backward path metric storing means for storing backward path metrics until soft decision information is calculated, by which a scale of a circuit can be further reduced.

10th Embodiment

Figure 20:
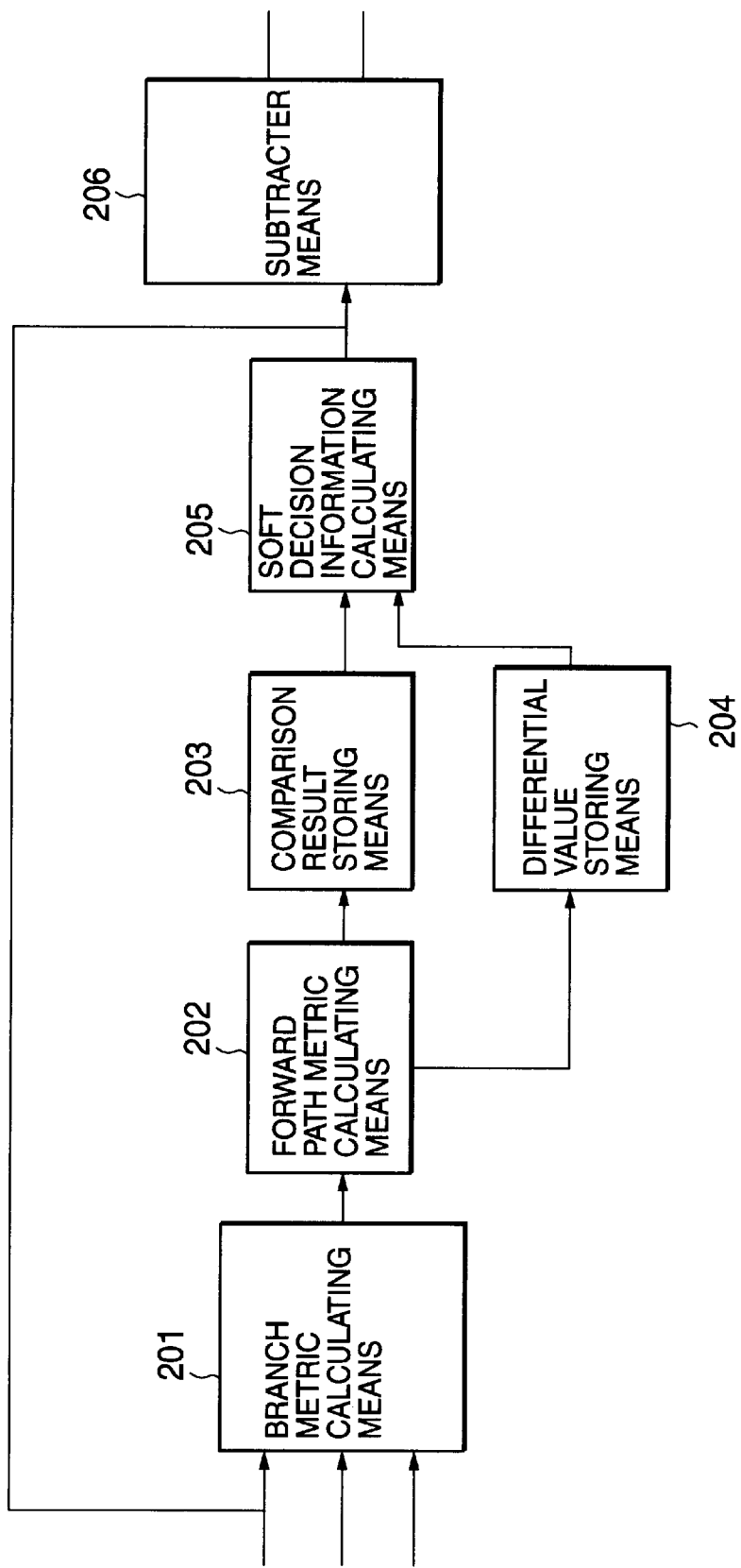
FIG. 20 is a configuration diagram of a soft decision device according to a 10th embodiment of the present invention.

Referring to FIG. 20, there is shown a block diagram of a decision device which is an error correcting decoder according to a 10th embodiment of the present invention, in which soft decision information is calculated according to the soft output Viterbi algorithm (SOVA) and it is then output.

In FIG. 20, there are shown branch metric calculating means 201, forward path metric calculating means 202, comparison result storing means 203 for storing a size comparison result obtained by the forward path metric calculating means 201, differential value storing means 204 for storing a differential value between two path metric values calculated by the forward path metric calculating means 202, soft decision information calculating means 205 for calculating soft decision information after decoding according to the SOVA algorithm based on the size comparison results stored in the comparison result storing means 203 and the differential values stored in the differential value storing means 204, and subtracter means 206.

Figure 21:
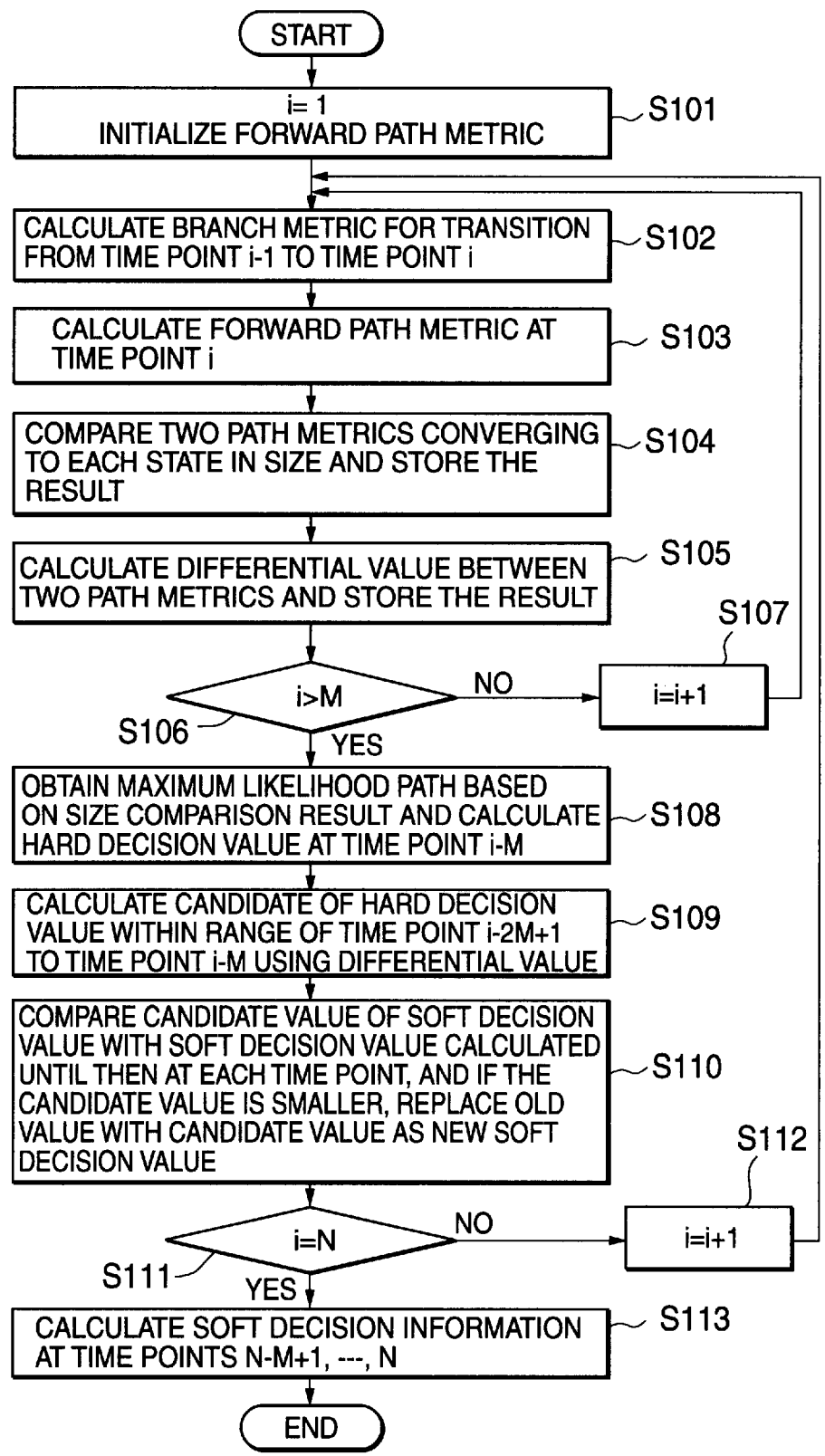
FIG. 21 is a flowchart of a turbo-code error correction decoding method according to the 10th embodiment of the present invention.

Referring to FIG. 21, there is shown a flowchart of an operation for error correction decoding with a soft decision device in FIG. 20.

In FIG. 21, there are shown Step S101 of setting an initial value for forward path metric calculation, Step S102 of calculating branch metrics at respective time points, Step S103 of calculating a forward path metric, Step S104 of comparing two path metrics in size converging to respective states and storing the result, Step S105 of calculating a differential value between the two path metrics and storing the value, Step S106 of judging whether or not time point i exceeds M, Step S107 of incrementing i, Step S108 of calculating a hard decision value with obtaining a maximum likelihood path, Step S109 of calculating a candidate of a soft decision value at time point i−2M+1 to time point i−M based on the result of the differential value, Step S110 of comparing the candidate value of the soft decision value with the soft decision value and replacing the candidate with the value, Step S111 of judging whether or not the time point i is set to N, and Step S112 of incrementing the time point i.

Next, the operation will be described below with reference to FIGS. 20 and 21.

First, in Step S101, the branch metric calculating means 201 is initialized. Next, in Step S102, a branch metric is calculated by the branch metric calculating means 201 and then transmitted to the forward path metric calculating means 202. Next, in Step S103, a forward path metric is calculated by the forward path metric calculating means 202 by using the transmitted branch metric. Furthermore, in the forward path metric calculating means 202, two paths metrics converging to respective states are compared with each other in size and the result is stored in the comparison result storing means 203 in Step S104 and a differential value between the two path metrics is stored in the comparison result storing means 203 in Step S105. Next, in Step S106, it is judged whether or not the time point i exceeds M in Step S106; unless it exceeds M, i is incremented and the operation in Step S102 and after is repeated. In this manner, the operation at the time point 1 to the time point M is repeated.

If the time point i exceeds M in Step S106, the maximum likelihood path within a range of the time point 1 to the time point M is selected and a hard decision value is calculated regarding the time point i by the soft decision information calculating means 205 in Step S108. Next, in Step S109, with the time point traced back regarding a path branching from the maximum likelihood path within a range of the time point 1 to the time point M, a differential value smallest among differential values between the maximum likelihood path and the hard decision data is selected to be a candidate value as reliability information regarding a branch transiting from the time point 0 to the time point 1, and it is considered as soft decision information of information bit corresponding to the time point i in Step S110.

In Steps S111 and S112, the time point i is incremented one by one so as to execute processing in Step S102. The size comparison result and the differential value between two paths calculated in Steps S104 and S105 are written into a portion in which a value at the oldest time point is stored in the comparison result storing means 203 and the differential value storing means 204, respectively.

Finally, in Step S113, soft decision outputs from the time point N to the time point N−M+1 are sequentially generated and output.

By this operation, storage capacities for the comparison result storing means 203 and the differential value storing means 204 can be reduced and therefore the soft decision device itself can also be downsized.

11th Embodiment

Figure 22:
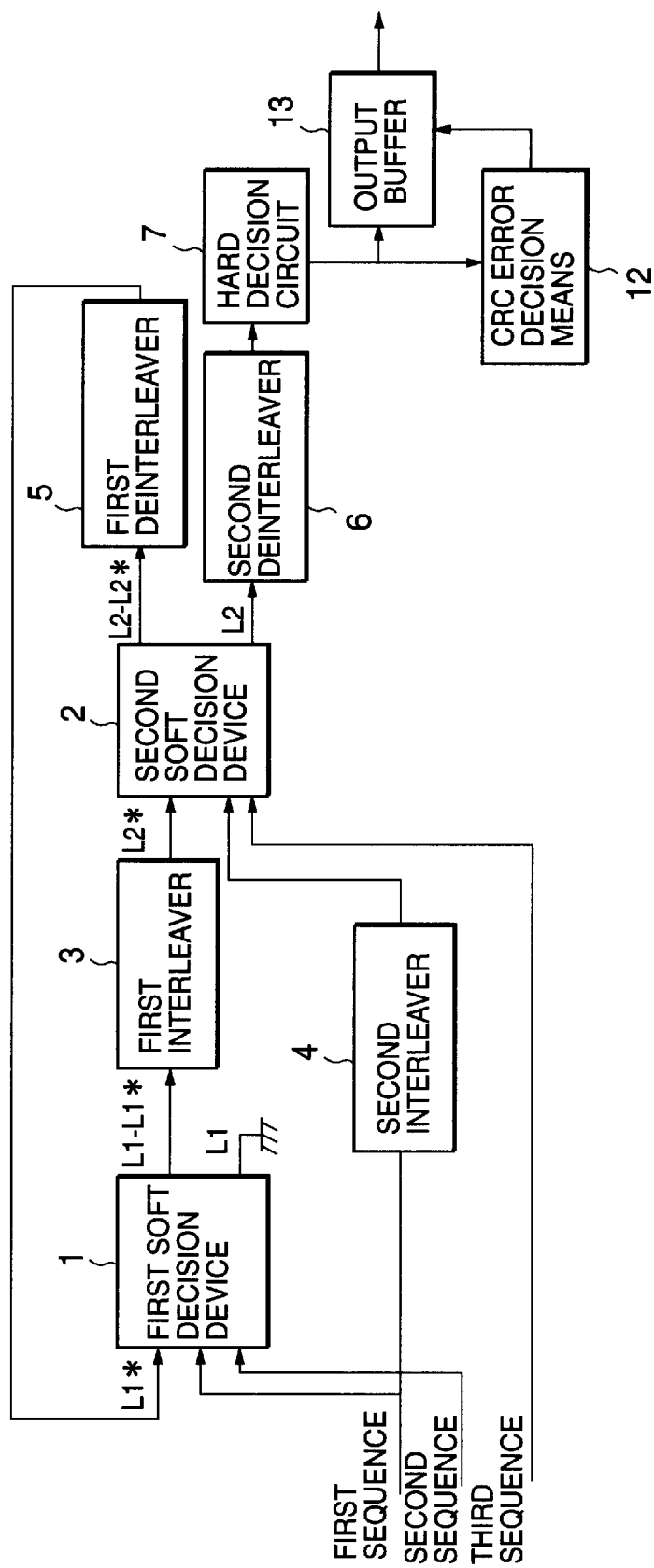
FIG. 22 is a configuration diagram of a turbo-code decoding apparatus according to an 11th embodiment of the present invention.

Referring to FIG. 22, there is shown a block diagram of a turbo-code decoding apparatus according to an 11th embodiment of the present invention, in which there is provided CRC error decision means for CRC check to judge whether or not processing is repeated based on the CRC check result in the turbo-code decoding apparatus.

In FIG. 22, there are shown CRC error decision means 12 and an output buffer 13.

Next, the operation will be described below with reference to FIG. 22.

Coded sequences which has been transmitted are received with errors. Data is encoded including CRC codes on an encoding apparatus side, and therefore the CRC codes are also included in the coded sequences. These received sequences are separated into the first, second, and third sequences; soft decision information L1 after decoding is generated from value L1* generated on the basis of the first sequence, the second sequence, and soft decision information generated from the second soft decision device 2 in the previous stage in the first soft decision device 1.

The value L1* entered in the first soft decision device 1 at the first decoding is set to 0 as a state of the lowest reliability to all bits. Next, L1−L1* is generated and entered in the first interleaver 3 and its order is changed so as to be L2*. Subsequently, in the second soft decision device 2, soft decision information L2 after decoding is generated based on the first sequence interleaved by the second interleaver 4, the third sequence, and L2* generated by the first interleaver 17.

The soft decision information L2 generated by the second soft decision device 2 is changed in its order by the second deinterleaver 6 and whether it is 0 or 1 is judged by hard decision means 7, and then the results are stored in an output buffer 13. Since CRC codes are also decoded and output by the hard decision means 7, a CRC check is performed by CRC error decision means 12 regarding data output from the hard decision means 7 and stored in the output buffer 13 and the CRC codes; if no error is detected, contents of the output buffer 13 are output and decoding operation is terminated.

If an error is detected, L2−L2* is calculated for L2 generated by the second soft decision device 2, its order is changed by the first deinterleaver 5 so as to achieve L1* and the value is used for decoding with the first soft decision device 1. For the number of repetitions within a predetermined number of times, the above operation is reexecuted.

If it is determined that there is no error in L2 by the CRC error decision means as described above, the repetition is not performed, by which a processing load can be reduced with reliability secured.

If there is a strong possibility that an error may be missed by the CRC error decision means 12, the contents of the output buffer 23 can be output as a decoding result only if no error is detected repeatedly by the predetermined number of times.

Furthermore, while the soft decision device is used to output the soft decision information in this embodiment, naturally a conventional MAP decoder can also be used.

12th Embodiment

Figure 23:
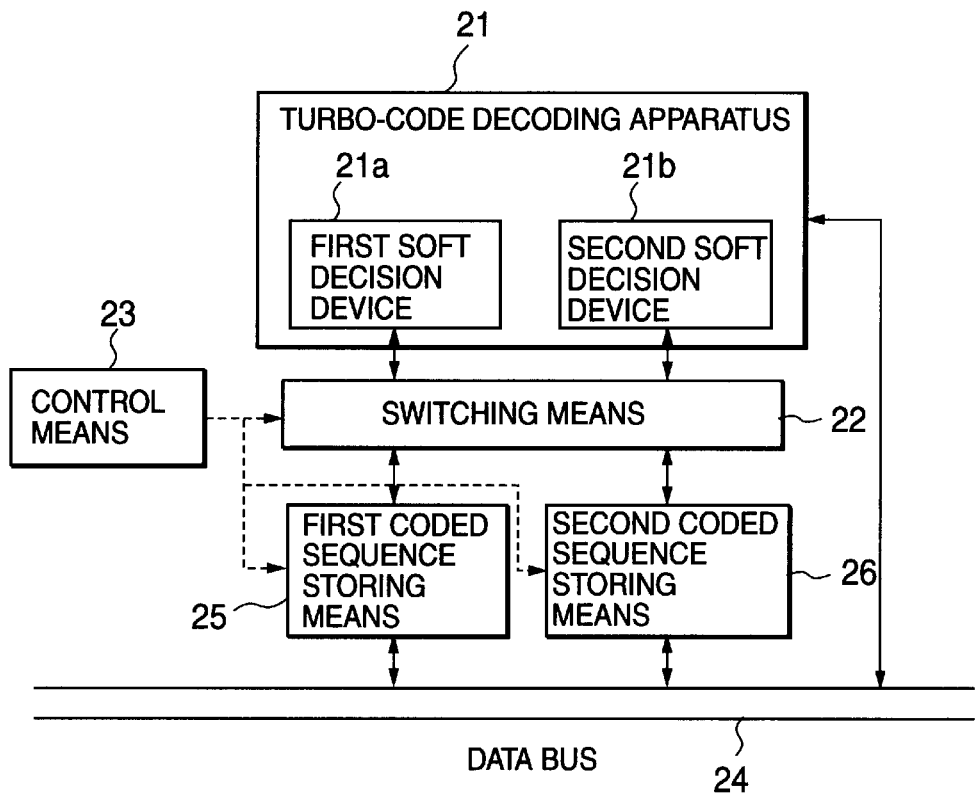
FIG. 23 is a turbo-code decoding system according to a 12th embodiment of the present invention.

Referring to FIG. 23, there is shown a block diagram of a turbo-code decoding system according to a 12th embodiment of the present invention.

In FIG. 23, there are shown a turbo-code decoding apparatus 21 having a first soft decision device 21a and a second soft decision device 21b, switching means 22 for switching a connection to the first soft decision device 21a and the second soft decision device 21b, control means 23 for controlling the switching means 22, a data bus 24, first coded sequence storing means 25 for storing coded sequences transmitted from an encoding apparatus via the data bus 24, and second coded sequence storing means 26 for storing coded sequences transmitted from the encoding apparatus via the data bus 24. A detailed configuration of the turbo-code decoding apparatus 21 is the same as one in the block diagram shown in FIG. 2 or FIG. 8. The turbo-code decoding apparatus 21 has an input point for a first sequence and an input point for a second sequence connected to the first soft decision device 21a and an input point for the first sequence and an input point for a third sequence connected to the second soft decision device 21b.

Figure 24:
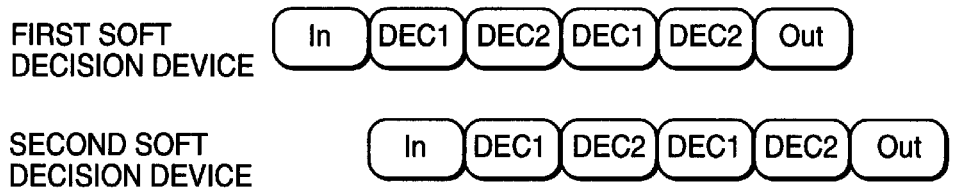
FIG. 24 is a timing diagram of processing coded sequences stored in the first coded sequence storing means according to the 12th embodiment of the present invention.

Referring to FIG. 24, there is shown a timing diagram illustrating a processing procedure for coded sequences in the first soft decision device 21a and the second soft decision device 21b in the turbo-code decoding apparatus shown in FIG. 23.

Next, the operation will be described below with reference to FIG. 23.

First, a first coded sequence data is input from the data bus 24 to the first coded sequence storing means 25 to be stored. After all the input to the first coded sequence storing means 25 is completed, a second coded sequence data is input from the data bus 24 to the second coded sequence storing means 26 to be stored. At the same time, the control means 23 operates the switching means 22 to connect the first coded sequence storing means 25 to the first soft decision device 21a, by which the first coded sequence data stored in the first coded sequence storing means 25 is input to the first soft decision device 21a via the switching means 22, decoding is performed with the first and second sequences, and then soft decision information is generated to be output.

After a completion of the soft decision output processing in the first soft decision device 21a, the control means 23 operates the switching means 22 to connect the first coded sequence storing means 25 to the second soft decision device 21b, by which the first coded sequence data stored in the first coded sequence storing means 25 is input to the second soft decision device 21b via the switching means 22, decoding is performed with the first and third sequences, and then soft decision information is generated to be output. At the same time, the control means 23 operates the switching means 22 to connect the second coded sequence storing means 26 to the first soft decision device 21a, by which the second coded sequence data is input to the first soft decision device 21a via the switching means 26, decoding is performed with the first and second sequences, and then soft decision information is generated to be output.

Afterward, as shown in FIG. 24, the first coded sequence and the second coded sequence are input to the first soft decision device 21a and the second soft decision device 21b alternately, decoding is performed by the predetermined number of times, and then the decoding result of the first coded sequence is output from the data bus 24. At that time, the second coded sequence data is input to the second soft decision device 21b via the switching means 22 and the last decoding is performed with the first and third sequences. The decoding operation is then terminated by outputting a decoding result of the second coded sequence from the data bus 24.

By this operation, it is possible to process coded sequence data of the first soft decision device 21a and that of the second soft decision device 21b different from each other simultaneously, by which decoding processing can be performed at high speed.

The turbo-code decoding apparatus may be a conventional MAP decoder. If it is used, it is also possible to use a first MAP decoder and a second MAP decoder for data processing simultaneously, by which decoding processing can be performed at high speed.

13th Embodiment

Figure 25:
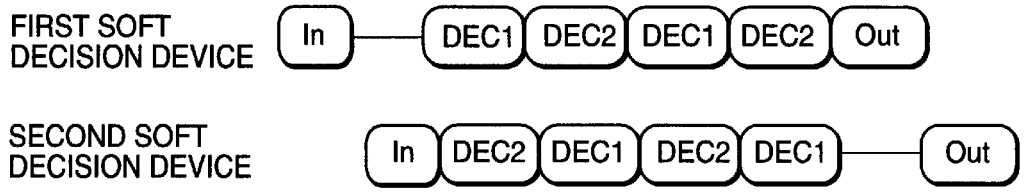
FIG. 25 is a timing diagram of processing coded sequences stored in the second coded sequence storing means according to the 13th embodiment of the present invention.
Figure 26:
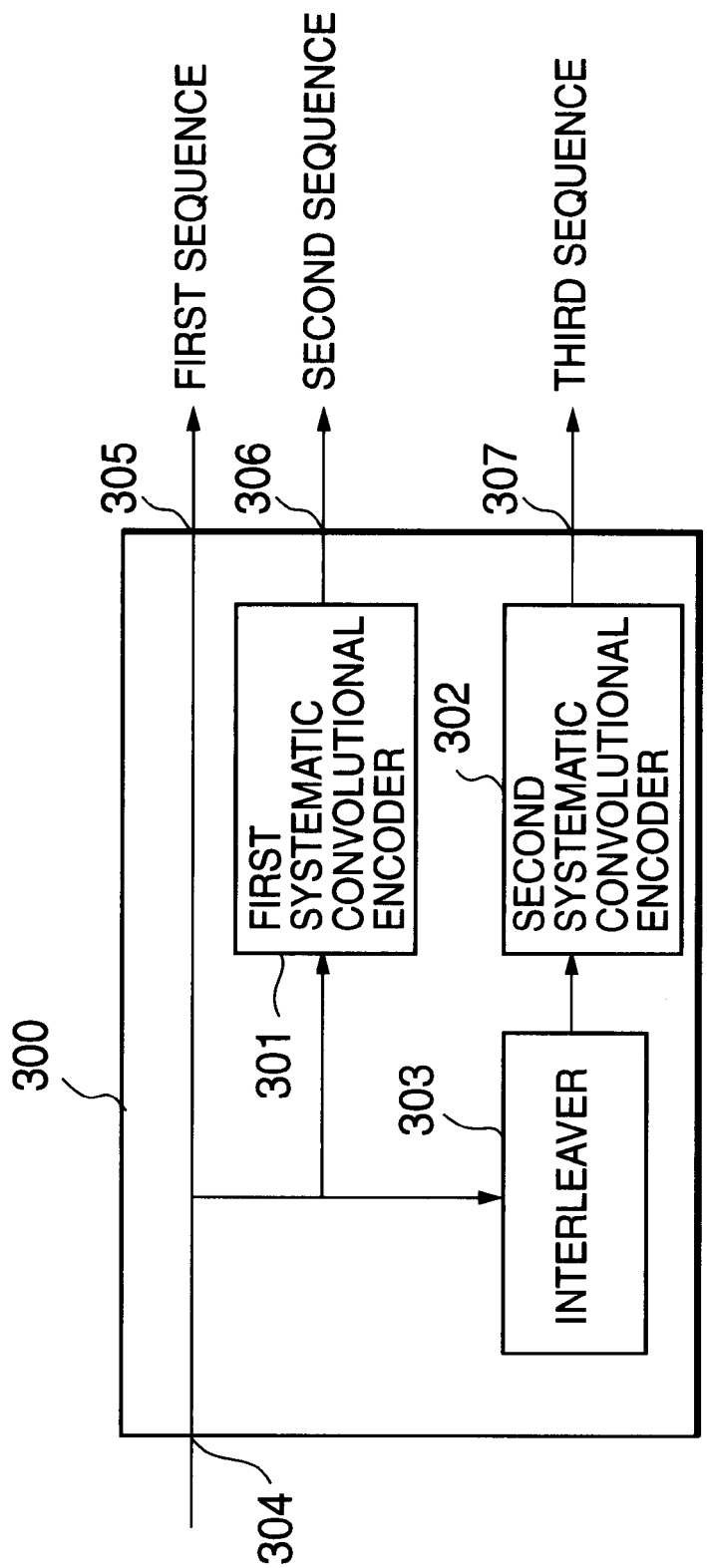
FIG. 26 is a configuration diagram of a turbo-code apparatus.
Figure 27:
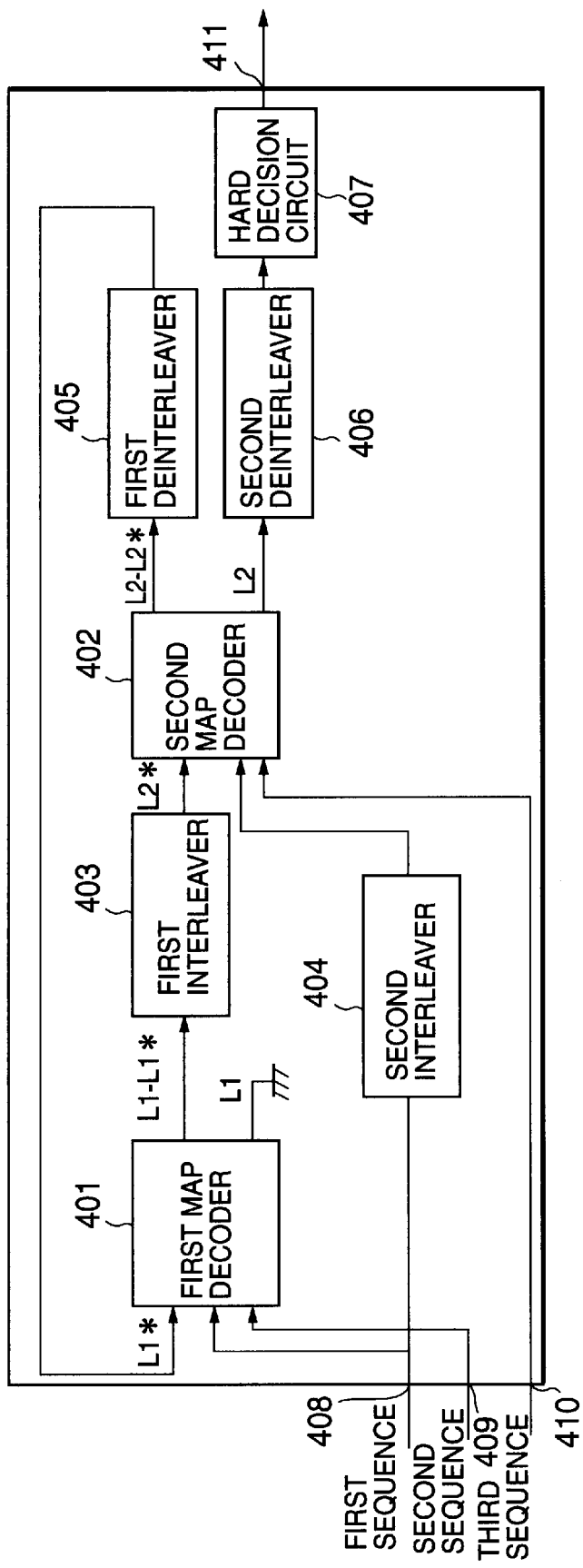
FIG. 27 is a configuration diagram of a conventional turbo-code decoding apparatus.
Figure 28:
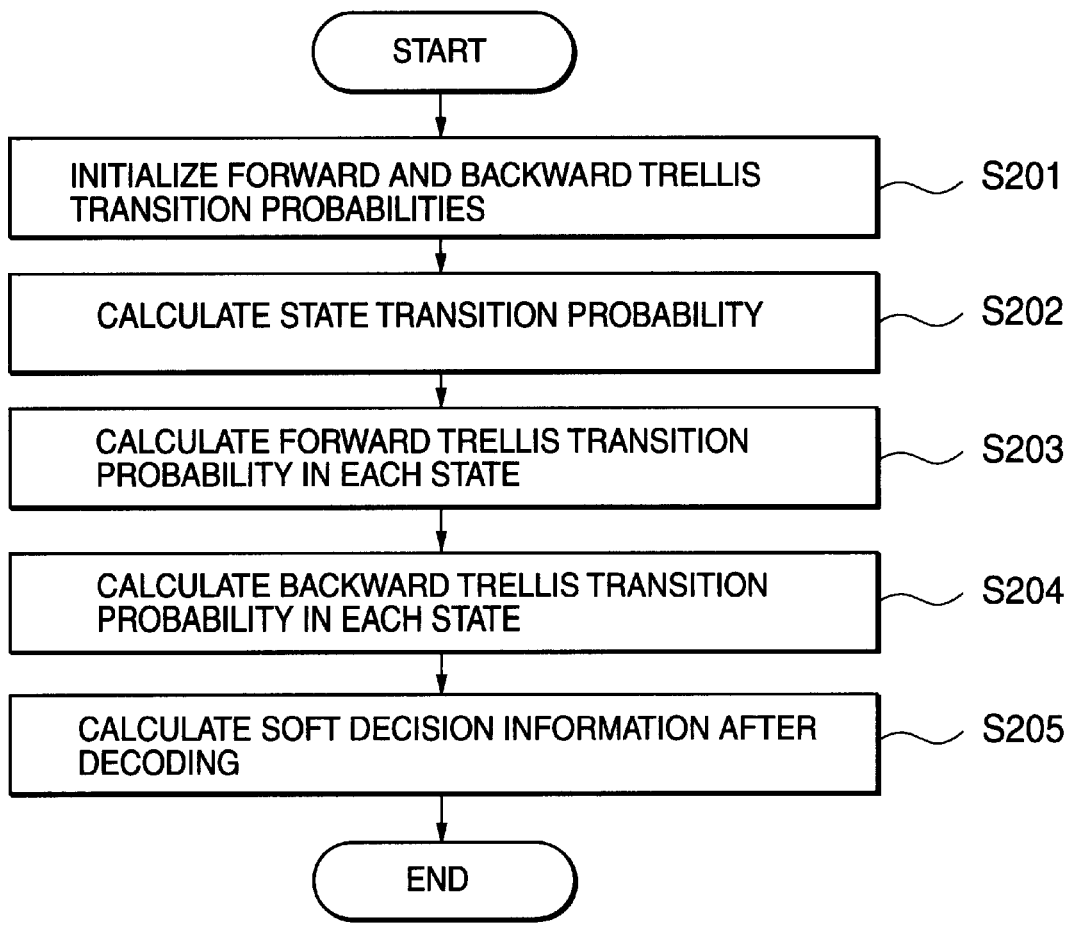
FIG. 28 is a flowchart of an error correction decoding method in a conventional MAP decoder.

Referring to FIG. 25, there is shown a timing diagram of a processing procedure for coded sequences of a first soft decision device and a second soft decision device for a turbo-code decoding apparatus according to a 13th embodiment of the present invention, in which a turbo-code decoding system has a control means 23 operating in a different manner from one in FIG. 23.

Next, the operation will be described below with reference to FIG. 23.

First, a first coded sequence data is input from a data bus 24 to the first coded sequence storing means 25 so as to be stored. After all inputs to the first coded sequence storing means 25 are completed, the second coded sequence data is input from the data bus 24 to the second coded sequence storing means 26 to be stored. At this point, the first coded sequence storing means 25 is connected neither to a first soft decision device 25a nor to a second soft decision device 25b.

After all the second coded sequences are stored in the second coded sequence storing means 26, the control means 23 operates the switching means 22 to connect the first coded sequence storing means 25 to the first soft decision device 21a and to connect the second coded sequence storing means 26 to the second soft decision device 21b, the first coded sequence data is input to the first soft decision device 21a for decoding with the first and second sequences and the soft decision information is generated to be output, while the second coded sequence data is input to the second soft decision device 21b for decoding with the first and third sequences and the soft decision information is generated to be output.

Afterward, as shown in FIG. 25, the first coded sequence and the second coded sequence are input to the first soft decision device 21a and the second soft decision device 21b alternately for processing, and after decoding by a predetermined number of times, a decoding result of the first coded sequence and that of the second coded sequence are output from the data bus 24, by which a decoding operation is terminated.

By this operation, two types of the coded sequence data can be processed at a time, whereby decoding processing can be performed at high speed.

The many features and advantages of the invention are apparent from the detailed specification and thus it is intended by the appended claims to cover all such features and advantages of the invention which fall without the true spirit and scope thereof. Further,since numerous modifications and changes will readily occur to those skilled in the art, it is not desired to limit the invention to the exact construction and operation illustrated and described, and accordingly, all suitable modifications and equivalents may be resorted to, failing with the scope of the invention.

What is claimed is:

1. A turbo-code error correcting decoder, with N as the number of information bits submitted to turbo-code decoding, comprising:

branch metric calculating means for calculating a branch metric for a transition from time point t−1 (t=1, 2, - - - , N) to time point t;

branch metric storing means for storing said branch metric;

forward path metric calculating means for calculating a forward path metric at the time point t−1 after reading out the branch metric from said branch metric storing means;

forward path metric storing means for storing said forward path metric;

backward path metric calculating means for calculating a backward path metric at the time point t after reading out the branch metric from said branch metric storing means;

backward path metric storing means for storing said backward path metric; and soft decision information calculating means for calculating soft decision information after reading out the branch metric from said branch metric storing means, reading out the forward path metric from said forward path metric storing means, and reading out the backward path metric from said backward path metric storing means.

2. A turbo-code error correcting decoder, with N as the number of information bits submitted to turbo-code decoding, comprising:

branch metric calculating means for calculating a branch metric for a transition from time point t−1 (t=1, 2, - - - , N) to time point t;

branch metric storing means for storing said branch metric;

forward path metric calculating means for calculating a forward path metric at the time point t−1 after reading out the branch metric from said branch metric storing means;

forward path metric storing means for storing said forward path metric;

backward path metric calculating means for calculating a backward path metric at the time point t after reading out the branch metric from said branch metric storing means; and soft decision information calculating means for calculating soft decision information after receiving the backward path metric from said backward path metric calculating means, reading out the branch metric from said branch metric storing means, and reading out the forward path metric from said forward path metric storing means.

3. A turbo-code error correction decoding method, with N as the number of information bits submitted to turbo-code decoding, comprising the steps of:

(a) calculating a forward path metric based on a branch metric after calculating said branch metric for a transition to an adjacent time point; and (b) calculating N bits of soft decision information based on said branch metric, said forward path metric, and a backward path metric after calculating said backward path metric based on said branch metric.

4. A turbo-code error correction decoding method according to claim 3, wherein said step(a) comprises a step of executing calculation of a branch metric for a transition from time point t−1 to time point t, a decision of whether or not t is N, and calculation of a forward path metric at the time point t based on said branch metric if t is determined to be other than N during a transition of t from 1 to N and a step of setting an initial value of a backward path metric if t is determined to be N.

5. A turbo-code error correcting decoding method according to claim 4, wherein the initial value of the backward path metric is a forward path metric at the time point N.

6. A turbo-code error correction decoding method according to claim 3, wherein said step(b) comprises a step of executing calculation of a backward path metric at the time point t based on the branch metric during a transition from N to 1 and a step of executing calculation of the soft decision information at the time point t based on the branch metric, the forward path metric, and the backward path metric during a transition of t from 1 to N.

7. A turbo-code error correction decoding method according to claim 3, wherein said step(b) comprises a step of executing calculation of backward path metric at the time point t based on the branch metric and calculation of the soft decision information at the time point t based on the branch metric, the forward path metric, and the backward path metric during a transition of t from N to 1.

8. A turbo-code error correction decoding method, with N as the number of information bits submitted to turbo-code decoding, comprising the steps of:
(a) calculating soft decision information from time point 1 to time point N−M (N>M); and
(b) calculating soft decision information from time point N−M+1 to time point N,
wherein said step(a) comprises an execution during a transition of t from 1 to N of a step of executing calculation of a branch metric for a transition from time point t−1 to time point t and calculation of a forward path metric at the time point t based on said branch metric while incrementing t until t exceeds M (N>M), a step of setting an initial value of a backward path metric at time point t−M based on said branch metric, and a step of calculating soft decision information at the time point t−M based on said branch metric, said forward path metric, and said backward path metric.

9. A turbo-code error correction decoding method according to claim 8, wherein an initial value of the backward path metric is a forward path metric at the time point t.

10. A turbo-code error correction decoding method according to claim 8, wherein said step(b) comprises a step of executing backward path metric calculation at the time point t based on the branch metric during a transition of t from N to N−M+1 and a step of executing a soft decision information calculation at the time point t based on said branch metric, said forward path metric, and said backward path metric during a transition of t from N−M+1 to N.

11. A turbo-code error correction decoding method according to claim 8, wherein said step(b) further comprises a step of executing backward path metric calculation at the time point t based on the branch metric and soft decision information calculation at the time point t based on said branch metric, said forward path metric, and said backward path metric during a transition of t from N to N−M+1.

12. A turbo-code error correction decoding method, with N as the number of information bits submitted to turbo-code decoding, comprising the steps of:
(a) initializing variable m,
(b) calculating soft decision information from time point 1 to time point mK while incrementing the variable m; and
(c) calculating soft decision information from time point mK+1 to time point N,
wherein said step(a) includes a repetition of a step of executing calculation of a branch metric for a transition from the time point t−1 to the time point t and calculation of a forward path metric at the time point t based on said branch metric during a transition of to mK+M (K<M<N) or to N, a step of setting an initial value of the backward path metric, a step of calculating a backward path metric at the time point t based on said branch metric during a transition of t from mK+K−1 to mK+1, and a step of calculating soft decision information at the time point t based on said branch metric, said forward path metric, and said backward path metric during a transition of t from mK+1 to mK+K, while incrementing m during a transition of t up to N.

13. A turbo-code error correction decoding method according to claim 12, wherein the initial value of the backward path metric is a forward path metric at the time point t.

14. A turbo-code error correction decoding method according to claim 12, wherein said step(c) comprises a step of executing backward path metric calculation at the time point t based on the branch metric during a transition of t from N to mK+1 and a step of executing soft decision information calculation at the time point t based on said branch metric, said forward path metric, and said backward path metric during a transition of t from mK+1 to N.

15. A turbo-code error correction decoding method according to claim 12, wherein said step(c) further comprises a step of executing backward path metric calculation at the time point t based on the branch metric and soft decision information calculation at the time point t based on said branch metric, said forward path metric, and said backward path metric during a transition of t from N to mK+1.

16. A turbo-code error correcting decoder, with N as the number of information bits submitted to turbo-code decoding, comprising:
branch metric calculating means for calculating a branch metric for a transition from time point t−1 (t=1, 2, - - -, N) to time point t;
forward path metric calculating means for calculating a plurality of forward path metrics including a forward path metric at the time point t−1, a size comparison result of two of said plurality of forward path metrics converging to respective states, and a differential value therebetween;
comparison result storing means for storing said comparison result;
differential value storing means for storing said differential value; and
soft decision information calculating means for calculating soft decision information based on the comparison result read from said comparison result storing means and the differential value read from said differential value storing means by using a SOVA algorithm.

* * * * *